United States Patent [19]
Matsuda et al.

[11] Patent Number: 6,057,241
[45] Date of Patent: May 2, 2000

[54] METHOD OF MANUFACTURING A SEMICONDUCTOR INTEGRATED CIRCUIT DEVICE

[75] Inventors: Yasushi Matsuda, Kodaira; Hideo Miura, Koshigaya; Hirohiko Yamamoto, Hachioji; Masamichi Kobayashi, Kodaira; Shuji Ikeda, Koganei; Akira Takamatsu, Hamura; Norio Suzuki, Mito; Hirofumi Shimizu, Nakakoma-gun; Yasuko Yoshida, Sayama; Kazushi Fukuda, Ome; Shinichi Horibe, Akiruno; Toshio Nozoe, Higashiyamato, all of Japan

[73] Assignees: Hitachi, Ltd.; Hitachi ULSI Systems Co., Ltd., both of Tokyo, Japan

[21] Appl. No.: 09/066,757

[22] Filed: Apr. 27, 1998

[30] Foreign Application Priority Data

Apr. 30, 1997 [JP] Japan .................................. 9-112467

[51] Int. Cl.$^7$ ................................................ H01L 21/477
[52] U.S. Cl. ........................... 438/689; 438/700; 438/701; 438/702; 438/719; 438/738
[58] Field of Search ...................................... 438/689, 710, 438/713, 719, 723, 724, 700, 701, 704, 640, 637

[56] References Cited

U.S. PATENT DOCUMENTS

| | | | |
|---|---|---|---|
| 4,576,834 | 3/1986 | Sobczak | 427/93 |
| 4,693,781 | 9/1987 | Leung et al. | 156/643 |
| 4,810,668 | 3/1989 | Ito | 437/67 |
| 4,906,585 | 3/1990 | Neppl et al. | 437/34 |

*Primary Examiner*—Benjamin L. Utech
*Assistant Examiner*—Lan Vinh
*Attorney, Agent, or Firm*—Antonelli, Terry, Stout & Kraus, LLP

[57] ABSTRACT

A silicon oxide film 2 which is exposed from a side wall of a groove 4a is etched to displace the silicon oxide film 2 backward toward an active region. The displacement amount is set to be equal to or more than a film thickness (Tr) of a silicon oxide film 5 to be formed on an inner wall of the groove 4a in a later thermal oxidation step and equal to or less than twice the film thickness (Tr) thereof. A shoulder portion of the groove 4a can be rounded by a low-temperature heat treatment at 1000° C. or less, by controlling a heat treatment period such that the film thickness (Tr) of the silicon oxide film 5 is more than the film thickness (Tp) of the silicon oxide film 2 and equal to or less than three times the film thickness (Tr) thereof (Tp<Tr≦3Tp)

32 Claims, 34 Drawing Sheets

METHOD OF MANUFACTURING A SEMICONDUCTOR INTEGRATED CIRCUIT DEVICE

BACKGROUND OF THE INVENTION

The present invention relates to a technique for manufacturing a semiconductor integrated circuit device, and more particularly to a technique which is effective in a method of forming an element isolation groove in a semiconductor substrate.

A technique of LOCOS (Local Oxidation of Silicon) is generally known as an element isolation technique, and developments of new element isolation techniques substitutable for the technique of the LOCOS have been promoted in accordance with downsizing of a semiconductor element.

The following excellent advantages can be obtained by an element isolation groove formed by embedding an insulating film such as a silicon oxide film or the like in a groove formed in a semiconductor substrate.
(a) The element isolation interval between the element isolation grooves can be reduced.
(b) Control of the film thickness of an element isolation film can be facilitated and setting of field inversion voltages can be easily carried out.
(c) An anti-inversion layer can be separated from a diffusion layer and a channel region for an element by separately injecting impurities to the side wall and the bottom of the groove, so that subthreshold characteristics can be maintained and connection leakage and back-gate effects can be advantageously reduced.

To form an element isolation groove in a semiconductor substrate, a semiconductor substrate is subjected to a heat treatment to form a thin silicon oxide film (or pad oxide film) The pad oxide film is formed for the purpose of relaxing a stress onto the substrate when sintering a silicon oxide film embedded in the groove in a later step, and for the purpose of protecting an active region when removing a silicon nitride film used for a mask for oxidation.

Next, a silicon nitride film is deposited on the pad oxide film by a CVD (Chemical Vapor Deposition) method, to remove a silicon nitride film from an element isolation region by etching with a mask of a photoresist. Since it is characteristic of a silicon nitride film to be hardly oxidized, a silicon nitride film is used as a mask for preventing oxidation of the surface of a substrate below the film. In addition, a silicon nitride film is used as a mask when etching a substrate to form a groove.

Next, a groove is formed in a semiconductor substrate by etching with a silicon nitride film as a mask, and thereafter the substrate is oxidized in a vapor atmosphere at 1000° C. or more, to form a thin silicon oxide film on the inner wall of the groove. The silicon oxide film is formed for the purpose of eliminating etching damages caused on the inner walls of the groove, and for the purpose of relaxing a stress onto a silicon oxide film which is embedded in the groove in a later step.

Subsequently, a silicon oxide film is embedded in the groove by depositing a silicon oxide film on the semiconductor substrate by a CVD method, and thereafter the silicon oxide film embedded in the groove is subjected to sintering. The sintering is a step for improving the film quality of the silicon oxide film embedded in the groove.

Next, a chemical mechanical polishing method or the like is used to remove the portion of the silicon oxide film above the silicon nitride film, so that the silicon oxide film remains only in the groove. Thus, an element isolation groove filled with a silicon oxide film is formed. Thereafter, the silicon nitride film used as a mask for oxidation is removed by etching, and further, a semiconductor element is formed in an active region.

If a shoulder portion of the element isolation groove formed by the method described above is angular, the gate oxide film which is formed above the element isolation groove in a later step is locally thinned at the shoulder portion, resulting in a problem (or hump characteristic) that a drain current flows even with a low voltage. Therefore, a proposal has been made as for a technique for rounding the shoulder portion of the element isolation groove.

Although wet or steam oxidation is said to be effective to sinter the silicon oxide film embedded in the groove, the inside (or the side wall in particular) of the groove is easily oxidized if the wet oxidation is carried out (i.e., the bottom of the groove is relatively hard to be oxidized because oxidation starts from the surface of the groove). If the side wall is thus oxidized, there appears a problem that an active region is narrowed. In addition, if the oxide film is thick, a large stress is generated at the interface with the substrate and causes a problem that the shoulder portion which is once rounded becomes angular again. Therefore, a proposal has been made as for a technique of covering the inner wall of the groove with a silicon nitride film to prevent the side wall of the groove from being oxidized.

Japanese Patent Laid-Open No. 2-260660 discloses a technique in which a groove is formed at an element isolation region in a semiconductor substrate by etching with use of masks of a thermal oxide film and a silicon nitride film which are formed on the surface of an active region of the semiconductor substrate, and thereafter a pad oxide film exposed from the end surface of a groove is wet-etched to be recessed backward by 0.1 µm so that a birds beak more easily enters during oxidation. Thereafter, a thermal oxide film is formed on the inner wall of the groove to round the shoulder portion of the groove. According to this method, a parasitic channel effect can be restricted by rounding the shoulder portion of the groove, so that a MOS integrated circuit having an excellent cut-off characteristic can be obtained.

In a groove forming method described in Japanese Patent Laid-Open No. 4-303942, a groove is formed at an element isolation region of a semiconductor substrate by etching with use of masks of a thermal oxide film, a silicon nitride film, and a PSG film formed on the surface of an active region of a semiconductor substrate, and thereafter the PSG film is removed by wet-etching (in which the thermal oxide film below the silicon nitride film is undercut by about 500 to 1000 angstrom). Next, the semiconductor substrate is oxidized to form a thermal oxide film on bottom, side wall, and undercut portions, thereby rounding the shoulder portion. Thereafter, an insulating film is embedded in the groove. According to this method, the undercut portion is filled with a thermal oxide film, thereby eliminating concave portions. Thus, an insulating film is completely embedded in the groove and formation of voids can be prevented.

A groove forming method described in Japanese Patent Laid-Open No. 8-97277 is as follows. Firstly, a groove is formed in a substrate, and a thermal oxide film is formed on the inner surface (including surfaces of side walls and bottom) of the groove. A silicon nitride film is formed on the thermal oxide film, and a silicon film (which is of amorphous, or polycrystal silicon, or monocrystal silicon) is further formed on the silicon nitride film. Thereafter, the inside of the groove is filled with a silicon oxide film and the surface thereof is flattened. A silicon oxide film is deposited on the entire surface of the substrate, and thereafter the silicon film is oxidized in an oxidation atmosphere containing vapor at about 950° C. and changed into a silicon oxide film, before carrying out flattening. In this state, the silicon substrate is protected by the silicon nitride film and is therefore not oxidized. According to this method, a silicon oxide film can be embedded without causing voids by forming a thin film (e.g., a silicon film) on the inner surface of the groove which has good compatibility with a silicon oxide film. Although the silicon film in the groove must be oxidized and changed into a silicon oxide film later, the silicon substrate is not oxidized when oxidizing the silicon film since a silicon nitride film is provided between the silicon film and the substrate. Therefore, the element characteristic is not deteriorated.

SUMMARY OF THE INVENTION

In conventional groove forming methods as described above, a heat treatment at a high temperature of 1000 C. or more is carried out to round the shoulder portion of an element isolation groove. However, in case of a wafer having a large diameter, dislocation (which causes a core of a defect) easily occurs in a heat treatment at a high temperature of 1000° C. or more, so that it will be difficult to introduce high-temperature heat treatment process at 1000° C. or more in the future as the diameter of a wafer has been enlarged. On the other hand, in case of a low-temperature heat treatment at a temperature of 1000° C. or less, there is a problem that the shoulder portion of an element isolation groove is difficult to be rounded.

It is an object of the present invention to provide a technique capable of optimizing the shape of an element isolation groove to promote downsizing of an element and to improve electric characteristics.

Another object of the present invention is to provide a technique capable of reducing a harmful influence on element characteristics from a stress onto an active region caused by sintering of a silicon oxide film embedded in an element isolation groove.

These and other objects and novel features of this invention will become apparent from the following description in this specification and from the accompanying drawings.

Representative aspects of this invention disclosed in this specification maybe briefly summarized as follows.

(1) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate; (b) etching a portion of the first silicon oxide film which is exposed from the groove to displace the first silicon oxide film backward toward an active region; (c) thermally oxidizing the semiconductor substrate to form a second silicon oxide film on an inner wall of the groove; (d) forming a third silicon oxide film on the main surface of the semiconductor substrate to fill the groove with the third silicon oxide film; (e) subjecting the semiconductor substrate to a heat treatment, thereby to sinter the third silicon oxide film filled in the groove; (f) removing a portion of the third silicon oxide film which is positioned above the silicon nitride film such that the third silicon oxide film remains only in the groove; and (g) removing a portion of the silicon nitride film which is positioned above a surface of the active region whose periphery is defined by the element isolation groove, and subsequently forming a semiconductor element at the active region, wherein: a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

(2) In a method of manufacturing a semiconductor integrated circuit device according to the present invention, each of a thermal oxidation temperature for forming the first silicon oxide film, a thermal oxidation temperature for forming the second silicon oxide film, and a heat treatment temperature for sintering the third silicon oxide film is equal to or less than 1000° C.

(3) In a method of manufacturing a semiconductor integrated circuit device according to the present invention, a thermal oxidation temperature for forming the second silicon oxide film is equal to or more than 800° C. and equal to or less than 1000° C.

(4) In a method of manufacturing a semiconductor integrated circuit device according to the present invention, the groove is tapered at a tapering angle θ equal to or less than 85°.

(5) In a method of manufacturing a semiconductor integrated circuit device according to the present invention, after the step (c) prior to the step (d) the inner wall of the groove is subjected to oxidation/nitriding processing, thereby to form a silicon nitride layer in a vicinity of an interface between the second silicon oxide film formed on the inner wall of the groove and the active region of the semiconductor substrate.

(6) In a method of manufacturing a semiconductor integrated circuit device according to the present invention, after the step (c) prior to the step (d) nitrogen is ion-implanted to a vicinity of an interface between the second silicon oxide film formed on the inner wall of the groove and the element isolation region of the semiconductor substrate, thereby to form a silicon nitride layer in the vicinity of the interface between the second silicon oxide film formed on the inner wall of the groove and the element isolation region of the semiconductor substrate.

(7) In a method of manufacturing a semiconductor integrated circuit device according to the present invention, the step (e) is carried out after the step (f).

(8) In a method of manufacturing a semiconductor integrated circuit device according to the present invention, the step (c) is carried out in an atmosphere containing nitrogen, thereby to form a second silicon nitride film having a film thickness which is set to be more than the film thickness of the first silicon oxide film and equal to or less than three times the film thickness thereof.

(9) In a method of manufacturing a semiconductor integrated circuit device according to the present invention, after the step (c) prior to the step (d) a second silicon nitride film is formed on at least a surface of the second silicon nitride film.

(10) A method of manufacturing a semiconductor integrated circuit device according the present invention comprises the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film and the first silicon oxide film in an element isolation region; (b) subjecting a portion of a surface of the semiconductor substrate which is exposed from the first silicon oxide film to isotropic etching; (c) selectively etching the semiconductor substrate in the element isolation region, thereby to form a groove in a main surface of the semiconductor substrate; (d) thermally oxidizing the semiconductor substrate to form a second silicon oxide film on an inner wall of the groove; (e) forming a third silicon oxide film on the main surface of the semiconductor substrate to fill the groove with the third silicon oxide film; (f) subjecting the semiconductor substrate to a heat treatment, thereby to sinter the third silicon oxide film filled in the groove; (g) removing a portion of the third silicon oxide film which is positioned above the silicon nitride film such that the third silicon oxide film remains only in the groove; and (h) removing a portion of the silicon nitride film which is positioned above a surface of an active region whose periphery is defined by the element isolation groove, and subsequently forming a semiconductor element at the active region.

(11) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a first silicon nitride film on the first silicon oxide film, and further subsequently etching selectively the first silicon nitride film, the first silicon oxide film, and the semiconductor substrate in an element isolation region, thereby to form a groove in a main surface of the semiconductor substrate; (b) etching a portion of the first silicon oxide film which is exposed from the groove to displace the first silicon oxide film backward toward an active region; (c) thermally oxidizing the semiconductor substrate to form a second silicon oxide film on an inner wall of the groove; (d) forming a second silicon nitride film on the semiconductor substrate including an inside of the groove by a CVD method; (e) forming a third silicon oxide film on the main surface of the semiconductor substrate to fill the groove with the third silicon oxide film; (f) subjecting the semiconductor substrate to a heat treatment, thereby to sinter the third silicon oxide film filled in the groove; (g) removing a portion of the third silicon oxide film and the second silicon nitride film which is positioned above the first silicon nitride film such that the third silicon oxide film and the second silicon nitride film remain only in the groove; (h) removing a portion of the first silicon nitride film which is positioned above a surface of the active region whose periphery is defined by the element isolation groove, by etching; (i) thermally oxidizing the third silicon oxide film at a shoulder portion of the element isolation groove to thicken a film thickness of the third silicon oxide film, thereby to fill a recess formed by removing the second silicon nitride film at the shoulder portion of the element isolation groove when removing the first silicon nitride film is removed by etching; and (j) forming a semiconductor element at the active region, wherein: a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

(12) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a first silicon nitride film on the first silicon oxide film, and further subsequently etching selectively the first silicon nitride film, the first silicon oxide film, and the semiconductor substrate in an element isolation region, thereby to form a groove in the main surface of the semiconductor substrate; (b) etching a portion of the first silicon oxide film which is exposed from the groove to displace the first silicon oxide film backward toward an active region; (c) thermally oxidizing the semiconductor substrate to form a second silicon oxide film on the inner wall of the groove; (d) forming a second silicon nitride film on the semiconductor substrate including an inside of the groove by a CVD method; (e) forming a third silicon oxide film on the main surface of the semiconductor substrate to fill the groove with the third silicon oxide film; (f) removing a portion of the third silicon oxide film and the second silicon nitride film which is positioned above the first silicon nitride film such that the third silicon oxide film and the second silicon nitride film remain only in the groove; (g) subjecting the semiconductor substrate to a heat treatment, thereby to sinter the third silicon oxide film filled in the groove, and oxidizing a surface of the first silicon nitride film and a surface of the second silicon nitride film at a shoulder portion of the element isolation groove; (h) removing a portion of the first silicon nitride film which is positioned above a surface of the active region whose periphery is defined by the element isolation groove and an oxide film at the surface of the portion, by etching; and (i) forming a semiconductor element at the active region, wherein: a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

(13) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate; (b) etching a portion of the first silicon oxide film which is exposed from the groove to displace the first silicon oxide film backward toward an active region; (c) forming a second silicon oxide film on the main surface of the semiconductor substrate to fill the groove with the second silicon oxide film; (d) thermally oxidizing the semiconductor substrate to sinter the second silicon oxide film filled in the groove, and to form a third silicon oxide film on an inner wall of the groove; (e) removing a portion of the second silicon oxide film which is positioned above the silicon nitride film such that the second silicon oxide film remains only in the groove; and (f) removing a portion of the silicon nitride film which is positioned above a surface of the active region whose periphery is defined by the element isolation groove, and subsequently forming a semiconductor element at the active region, wherein: a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

(14) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate; (b) etching a portion of the first silicon oxide film which is exposed from the groove to displace the first silicon oxide film backward toward an active region; (c) forming a second silicon oxide film on the main surface of the semiconductor substrate to fill the groove with the second silicon oxide film; (d) removing a portion of the second silicon oxide film which is positioned above the silicon nitride film such that the second silicon oxide film remains only in the groove; (e) thermally oxidizing the semiconductor substrate to sinter the second silicon oxide film filled in the groove, and to form a third silicon oxide film on an inner wall of the groove; and (f) removing a portion of the silicon nitride film which is positioned above a surface of the active region whose periphery is defined by the element isolation groove, and subsequently forming a semiconductor element at the active region, wherein: a displacement amount of the first silicon oxide film is set to be equal to or more than a film thickness of the second silicon oxide film and equal to or less than twice the film thickness thereof; and a film thickness of the third silicon oxide film is set to be more than a film thickness of the first silicon oxide film and equal to or less than three times the film thickness thereof.

(15) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate; (b) etching a portion of the first silicon oxide film which is exposed from the groove to displace the first silicon oxide film backward toward an active region; (c) thermally oxidizing the semiconductor substrate to form a second silicon oxide film on an inner wall of the groove; (d) forming a polycrystal silicon film on the main surface of the semiconductor substrate; (e) forming a third silicon oxide film on the main surface of the semiconductor substrate to fill the groove with the third silicon oxide film; (f) subjecting the semiconductor substrate to a heat treatment, thereby to sinter the third silicon oxide film filled in the groove, and oxidizing the polycrystal silicon film, thereby to change at least a part of the polycrystal silicon film into a silicon oxide film; (g) removing a portion of the third silicon oxide film and the silicon oxide film which is positioned above the silicon nitride film such that the third silicon oxide film and the silicon oxide film remain only in the groove; and (h) removing a portion of the silicon nitride film which is positioned above a surface of the active region whose periphery is defined by the element isolation groove, and subsequently forming a semiconductor element at the active region, wherein: a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

(16) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in a main surface of the semiconductor substrate; (b) etching a portion of the first silicon oxide film which is exposed from the groove to displace the first silicon oxide film backward toward an active region; (c) thermally oxidizing the semiconductor substrate to form a second silicon oxide film on an inner wall of the groove; (d) forming a polycrystal silicon film on the main surface of the semiconductor substrate; (e) forming a third silicon oxide film on the main surface of the semiconductor substrate to fill the groove with the third silicon oxide film; (f) removing a portion of the third silicon oxide film and the polycrystal silicon film which is positioned above the silicon nitride film such that the third silicon oxide film and the polycrystal silicon film remain only in the groove; (g) subjecting the semiconductor substrate to a heat treatment, thereby to sinter the third silicon oxide film filled in the groove, and oxidizing the polycrystal silicon film, thereby to change at least a part of the polycrystal silicon film into a silicon oxide film; and (h) removing a portion of the silicon nitride film which is positioned above a surface of the active region whose periphery is defined by the element isolation groove, and subsequently forming a semiconductor element at the active region, wherein: a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

(17) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in a main surface of the semiconductor substrate; (b) etching a portion of the first silicon oxide film which is exposed from the groove to displace the first silicon oxide film backward toward an active region; (c) thermally nitriding the semiconductor substrate to form a second silicon nitride film on an inner wall of the groove; (d) forming a second silicon oxide film on the main surface of the semiconductor substrate to fill the groove with the second silicon oxide film; (e) subjecting the semiconductor substrate to a heat treatment, thereby to sinter the second silicon oxide film filled in the groove; (f) removing a portion of the second silicon oxide film which is positioned above the first silicon nitride film such that the second silicon oxide film remains only in the groove; and (g) removing a portion of the first silicon nitride film which is positioned above a surface of the active region whose periphery is defined by the element isolation groove, and subsequently forming a semiconductor element at the active region.

(18) A method of manufacturing a semiconductor integrated circuit device according to the present invention comprises the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in a main surface of the semiconductor substrate; (b) etching a portion of the first silicon oxide film which is exposed from the groove to displace the first silicon oxide film backward toward an active region; (c) thermally oxidizing the semiconductor substrate to form a second silicon oxide film on an inner wall of the groove, and subsequently nitriding the second silicon oxide film, thereby to change at least a part of the second silicon oxide film into a silicon nitride film; (d) forming a third silicon oxide film on the main surface of the semiconductor substrate to fill the groove with the third silicon oxide film; (e) subjecting the semiconductor substrate to a heat treatment, thereby to sinter the third silicon oxide film filled in the groove; (f) removing a portion of the third silicon oxide film which is positioned above the first silicon nitride film such that the third silicon oxide film remains only in the groove; and (g) removing a portion of the first silicon nitride film which is positioned above a surface of the active region whose periphery is defined by the element isolation groove, and subsequently forming a semiconductor element at the active region.

(19) A method of manufacturing a semiconductor integrated circuit device comprising the steps of: (a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate; (b) etching a portion of the first silicon oxide film which is exposed from the groove to displace the first silicon oxide film backward toward an active region; (c) forming a polycrystal silicon film on the semiconductor substrate, and subsequently nitriding the polycrystal silicon film, thereby to change at least a part of the polycrystal silicon film into a silicon nitride film; (d) forming a second silicon oxide film on the main surface of the semiconductor substrate to fill the groove with the second silicon oxide film; (e) subjecting the semiconductor substrate to a heat treatment, thereby to sinter the second silicon oxide film filled in the groove; (f) removing a portion of the second silicon oxide film which is positioned above the first silicon nitride film such that the second silicon oxide film remains only in the groove; and (g) removing a portion of the first silicon nitride film which is positioned above a surface of the active region whose periphery is defined by the element isolation groove, and subsequently forming a semiconductor element at the active region.

DESCRIPTION OF THE PREFERRED EMBODIMENTS

Figure 1:
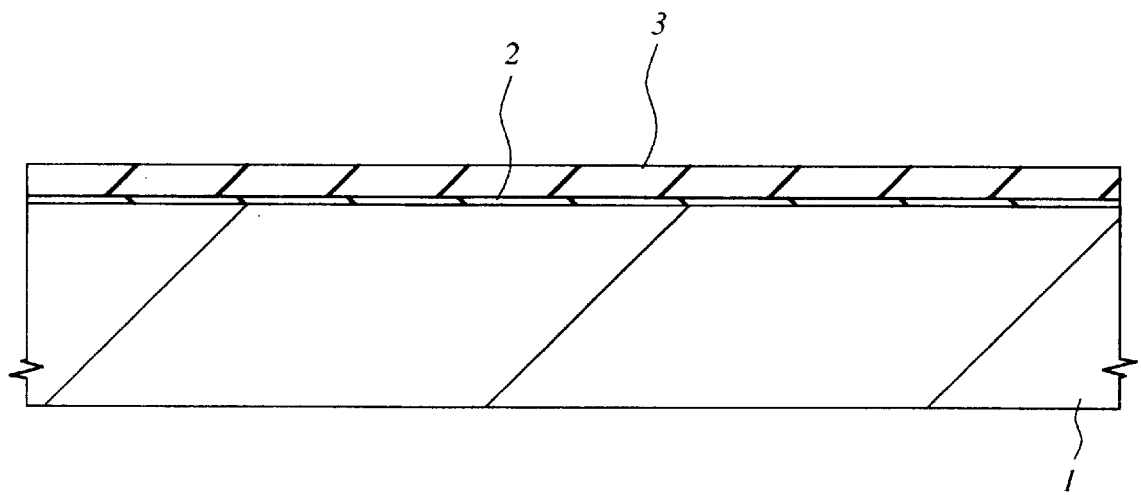
FIG. 1 is a cross-sectional view of a main part of a semiconductor substrate showing a method of manufacturing a semiconductor integrated circuit device, according to an embodiment 1 of the present invention.

The present invention will be described in detail by taking some embodiments for example. Throughout all the drawings used for the description of this invention, like reference numerals are assigned to components with the same function and the repetition of explanation on similar components is omitted.

Embodiment 1

Explanation will now be made of a complementary MISFET (CMOSFET) as an embodiment of the present invention with reference to FIGS. 1 to 22.

As shown in FIG. 1, for example, a semiconductor substrate 1 made of p-type monocrystal silicon having resistivity of about 1 to 10 Ω cm is thermally oxidized at 800 to 850° C. and a silicon oxide film (or pad oxide film) 2 is formed on the main surface of the semiconductor substrate 1 for the purpose of relaxing stresses and protecting active regions. Thereafter, a silicon nitride film 3 is formed above the silicon oxide film 2.

Figure 2:
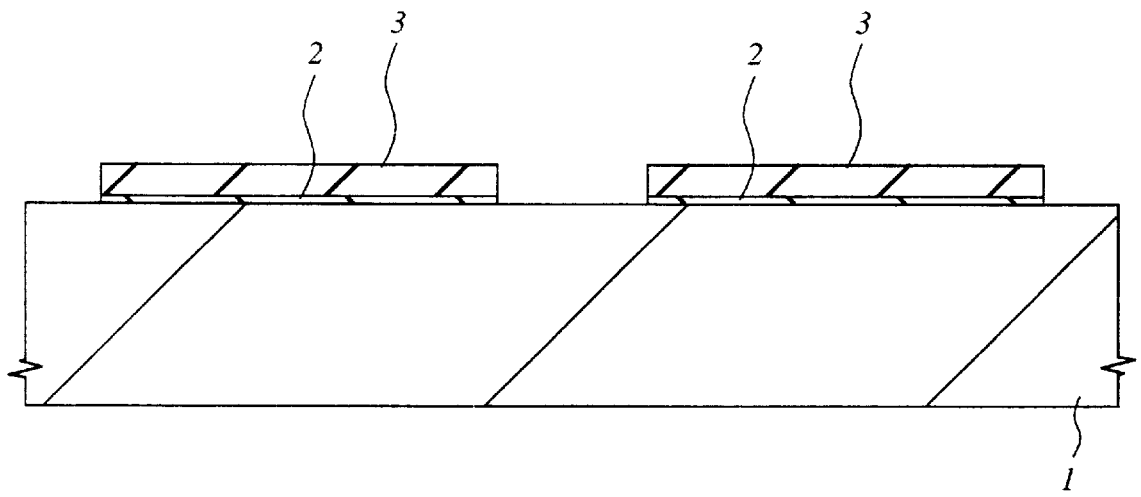
FIG. 2 is a cross-sectional view of a main part of the semiconductor substrate showing the method of manufacturing a semiconductor integrated circuit device according to the embodiment 1 of the present invention.
Figure 3:
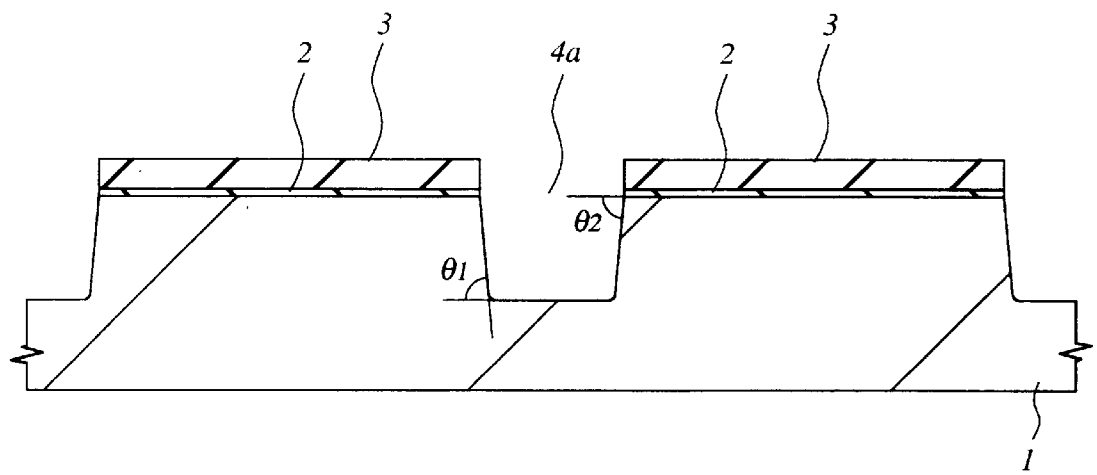
FIG. 3 is a cross-sectional view of a main part of the semiconductor substrate showing the method of manufacturing a semiconductor integrated circuit device according to the embodiment 1 of the present invention.
Figure 4:
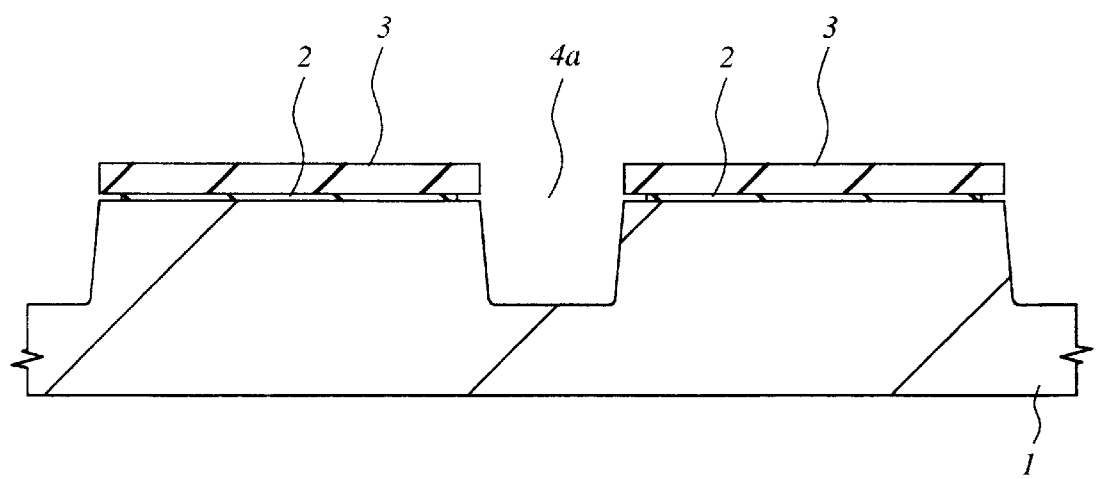
FIG. 4 is a cross-sectional view of a main part of the semiconductor substrate showing the method of manufacturing a semiconductor integrated circuit device according to the embodiment 1 of the present invention.
Figure 5:
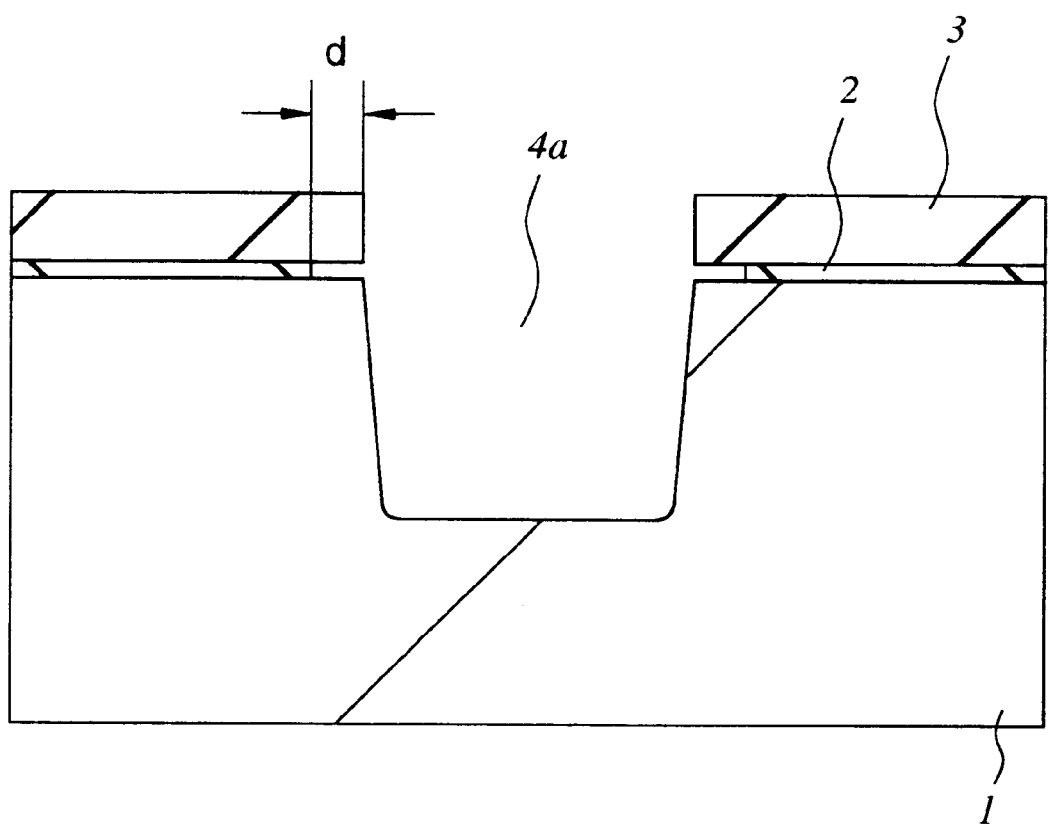
FIG. 5 is a cross-sectional view of a main part of the semiconductor substrate showing the method of manufacturing a semiconductor integrated circuit device according to the embodiment 1 of the present invention.

Next, the silicon nitride film 3 and the silicon oxide film 2 are removed from an element isolation region, as shown in FIG. 2, by etching with a photoresist used as a mask. Thereafter, as shown in FIG. 3, a groove 4a having a depth of 350 to 400 nm is formed in the semiconductor substrate 1 at the element isolation region by etching with use of the silicon nitride film 3 as a mask. The side walls of the groove 4a are tapered (at angles $\theta_1$ and $\theta_2$ which are 85° or less, for example) by adjusting the composition of a gas used for the etching of the semiconductor substrate 1. By thus tapering the side walls of the groove 4a, an insulating film can be easily embedded in the groove 4a.

Otherwise, the groove 4a may be formed by sequentially etching the silicon nitride film 3, the silicon oxide film 2, and the semiconductor substrate 1 at an element isolation region with use of a photoresist as a mask. In case of thus etching the semiconductor substrate 1 with use of a photoresist as a mask, it is possible to prevent removal of the silicon nitride film 3 used as a mask for thermal oxidation, so that the initial film thickness of the silicon nitride film 3 can be thinned.

Next, the inside of the groove 4a is wet-washed to remove residues of etching, and thereafter the portions of the silicon oxide film 2 which are exposed from the side walls of the groove 4a are removed by means of an etching solution containing hydrofluoric acid to displace the silicon oxide film 2 backward toward active regions. The displacement amount (d) of the silicon oxide film 2 is set to be equal to or more than the film thickness (Tr) of the silicon oxide film (5) formed on the inner walls of the groove 4a in a later thermal oxidation step and equal to or less than twice the film thickness (Tr) thereof (i.e., a range of $Tr \leq d \leq 2Tr$).

Since the portions of the silicon oxide film 2 which are exposed from the side walls of the groove 4a are displaced backward by a displacement amount within a range as described above, it is possible to round shoulder portions of the groove 4a when forming a silicon oxide film (5) on the inner walls of the groove 4a in a later thermal oxidation step. If the exposed portions of the silicon oxide film 2 are not displaced backward toward an active region or the displacement amount is small, oxidation of the shoulder portions of the groove 4a is restricted so that it is difficult to round the shoulder portions at a heat treatment temperature of 1000° C. or less. If the displacement amount is too large, the shoulder portions are also difficult to round. In this case, a birds beak of the silicon oxide film (5) formed on an inner wall of the groove 4a is elongated toward the active region and the active region is narrowed. Therefore, it is important to control the displacement amount (d) of the silicon oxide film 2 within the above-described range ($Tr \leq d \leq 2Tr$).

Figure 6:
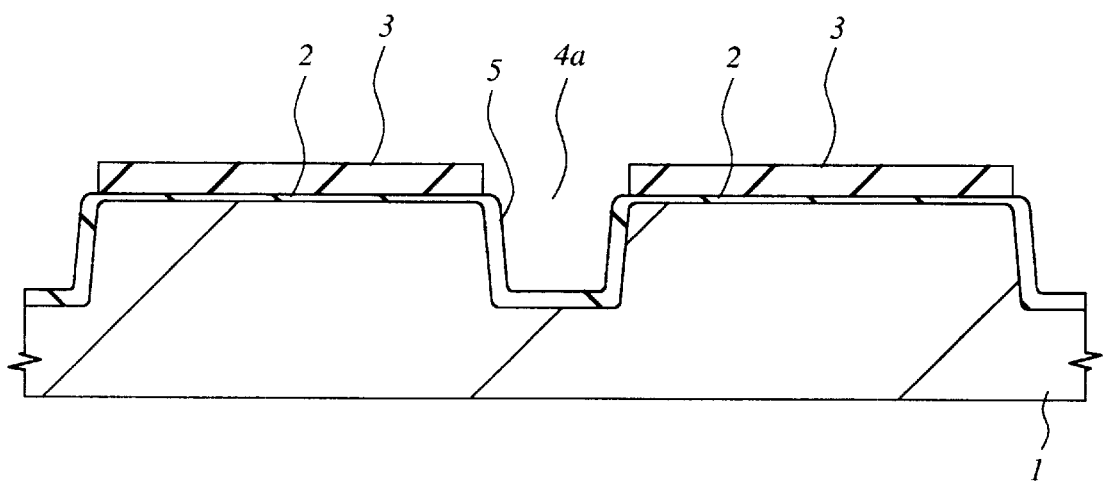
FIG. 6 is a cross-sectional view of a main part of the semiconductor substrate showing the method of manufacturing a semiconductor integrated circuit device according to the embodiment 1 of the present invention.
Figure 7:
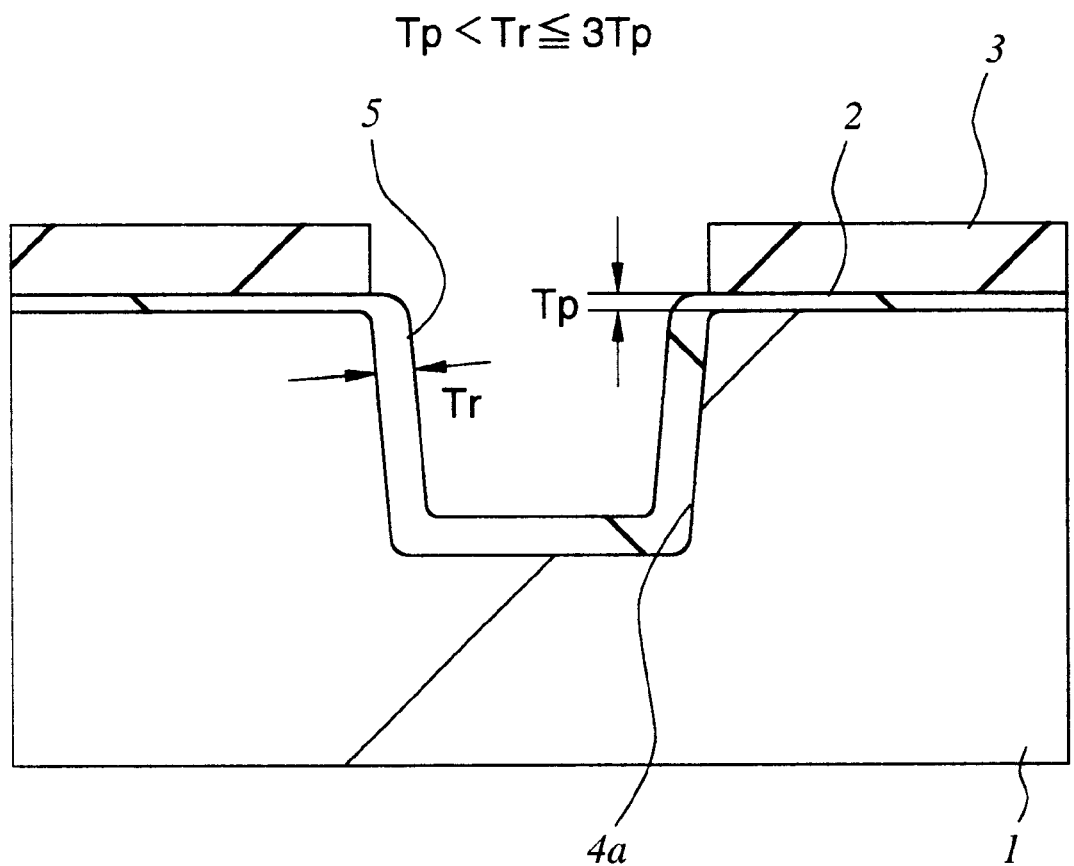
FIG. 7 is a cross-sectional view of a main part of the semiconductor substrate showing the method of manufacturing a semiconductor integrated circuit device according to the embodiment 1 of the present invention.

Next, as shown in FIGS. 6 and 7 (particularly in the enlarged view of FIG. 6), the semiconductor substrate 1 is thermally oxidized at 950° C., for example, to form a silicon oxide film 5 on the inner walls of the groove 4a. This silicon oxide film 5 is formed to recover damages of etching on the inner walls of the groove 4a and to relax a stress onto the silicon oxide film (6) embedded in the groove 4a in a later step. In this state, the shoulder portions of the groove 4a can be rounded by controlling the heat treatment period such that the film thickness (Tr) of the silicon oxide film 5 is more than the film thickness (Tp) of the silicon oxide film (or pad oxide film) 2 and equal to or less than three times the film thickness (Tp) thereof (i.e., a range of $Tp < Tr < 3Tp$). The silicon oxide film 5 is difficult to grow at a heat treatment temperature of 800° C. or less, and dislocation easily occurs at a heat treatment temperature of 1000° C. or more, particularly in case of a wafer having a large diameter. The heat treatment must be carried out within a temperature range from 800° C. to 1000° C.

If the film thickness (Tr) of the silicon oxide film 5 is equal to or less than the film thickness (Tp) of the silicon oxide film (or pad oxide film) 2, it is difficult to round the shoulder portions of the groove 4a. If the film thickness (Tr) of the silicon oxide film 5 is three or more times the film thickness (Tp) of the silicon oxide film 2, a large stress is generated between the silicon oxide film 5 which has grown and the silicon nitride film as a mask for thermal oxidation, so that the shoulder portions of the groove 4a are difficult to round. In this case, there is a problem that an active region is narrowed. Therefore, it is important to control the film thickness (Tr) of the silicon oxide film 5 within the above-described range (Tp<Tr=3Tp).

Figure 8:
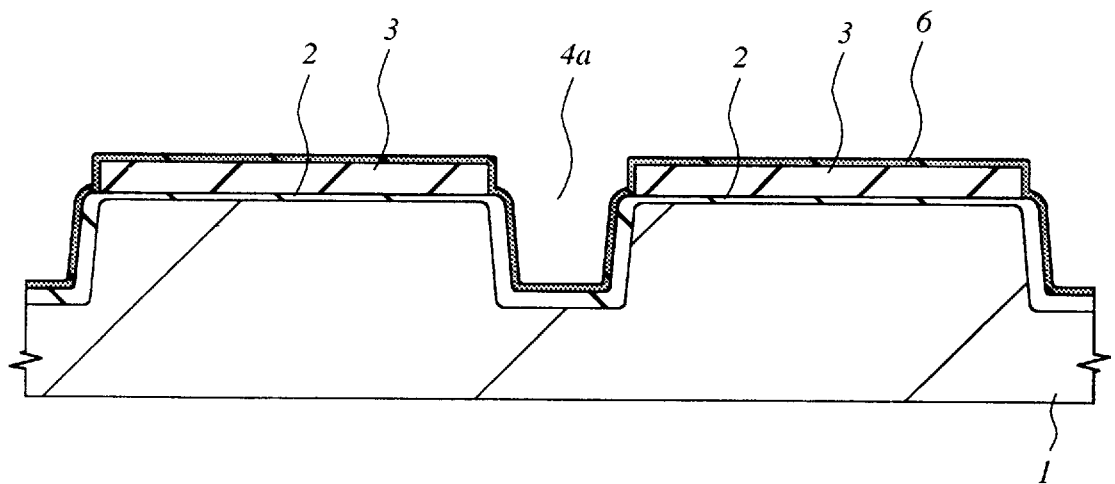
FIG. 8 is a cross-sectional view of a main part of the semiconductor substrate showing the method of manufacturing a semiconductor integrated circuit device according to the embodiment 1 of the present invention.
Figure 9:
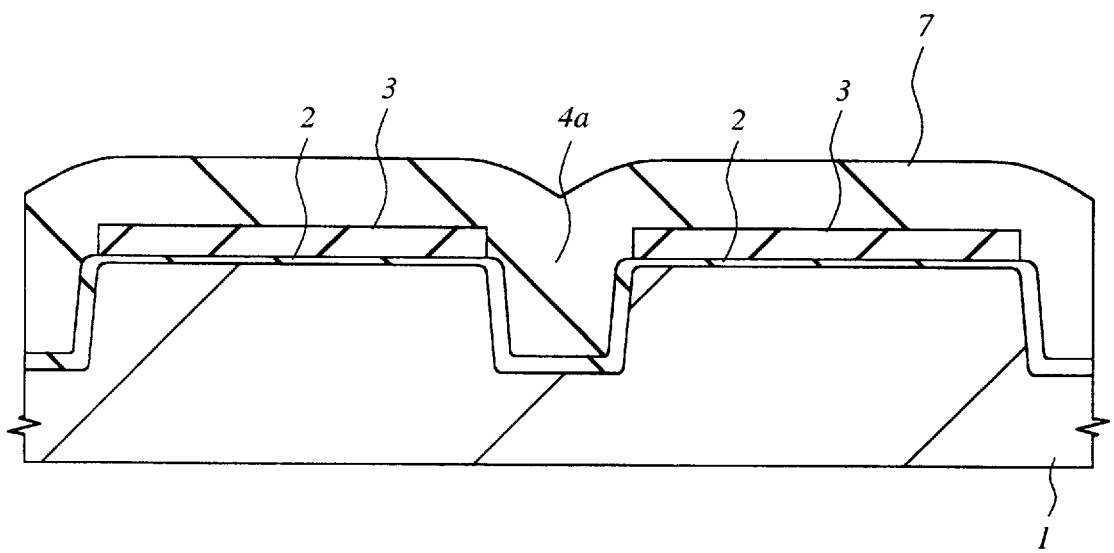
FIG. 9 is a cross-sectional view of a main part of the semiconductor substrate showing the method of manufacturing a semiconductor integrated circuit device according to the embodiment 1 of the present invention.

Next, as shown in FIG. 9, a silicon oxide film 7 is embedded in the groove 4a by depositing a silicon oxide film 7 on the main surface of the semiconductor substrate 1 by a CVD method. The silicon oxide film 7 uses a silicon oxide material having excellent fluidity such as a silicon oxide film formed with use of ozone ($O_3$) and tetraethoxysilane (($C_2H_5O)_4Si$), for example. In this case, prior to the step of depositing the silicon oxide film 7, a silicon nitride film 6 may be deposited thinly on the inner walls of the groove 4a as shown in FIG. 8 by a CVD method. Since the silicon nitride film 6 restrains the silicon oxide film 5 on the inner wall of the groove 4a from growing toward active regions when sintering the silicon oxide film 7 embedded in the groove 4a in a later step, it is possible to prevent a problem that the silicon oxide film 5 applies a stress onto the semiconductor substrate 1 at the active region to form a leakage path.

Next, the semiconductor substrate 1 is wet-oxidized at a temperature of 1000° C. or less, e.g., 850° C., thereby to perform sintering for improving the film quality of the silicon oxide film 7 embedded in the groove 4a.

Figure 10:
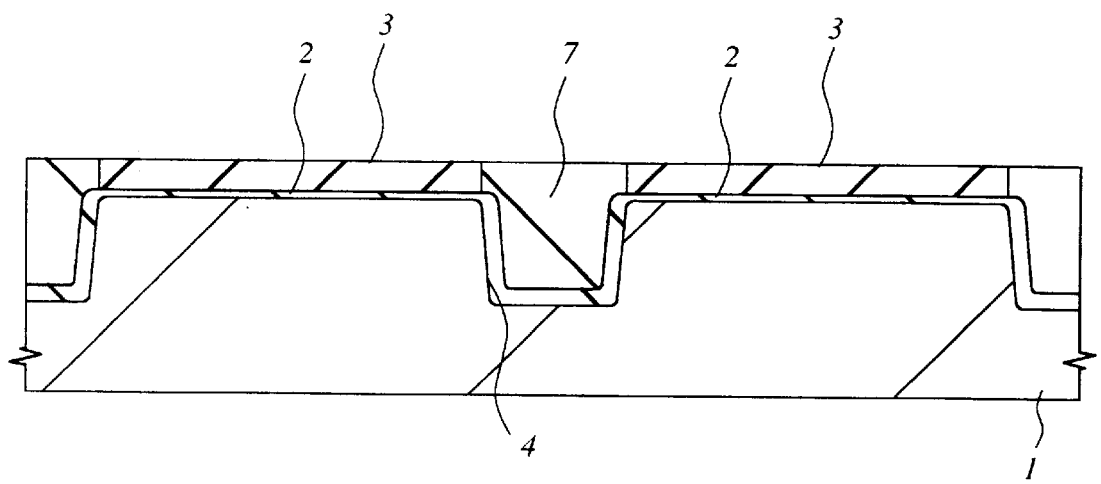
FIG. 10 is a cross-sectional view of a main part of the semiconductor substrate showing the method of manufacturing a semiconductor integrated circuit device according to the embodiment 1 of the present invention.
Figure 11:
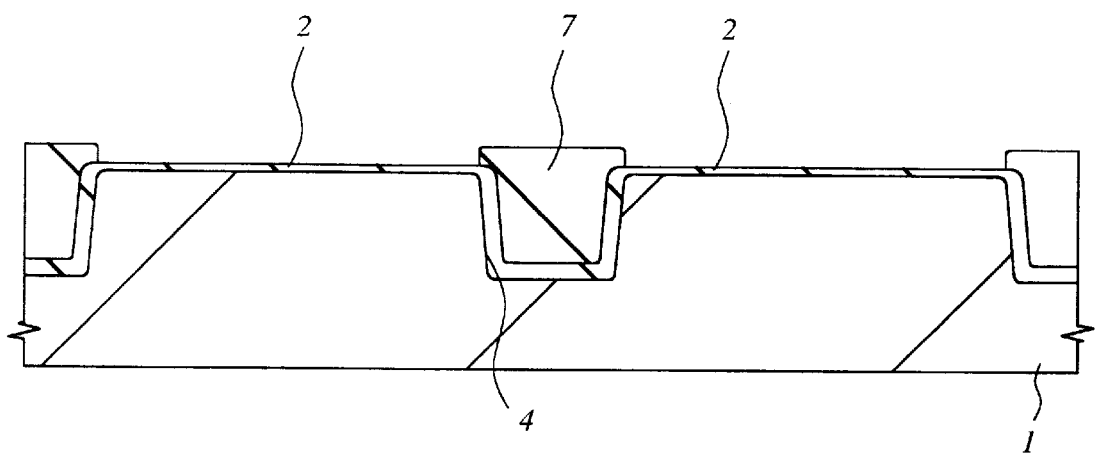
FIG. 11 is a cross-sectional view of a main part of the semiconductor substrate showing the method of manufacturing a semiconductor integrated circuit device according to the embodiment 1 of the present invention.
Figure 12:
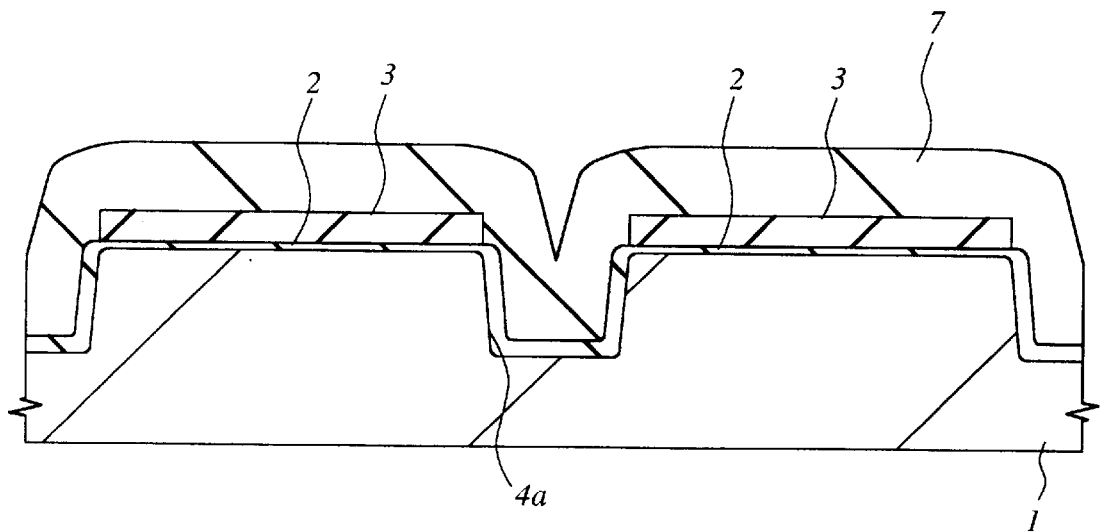
FIG. 12 is a cross-sectional view of a main part of the semiconductor substrate showing the method of manufacturing a semiconductor integrated circuit device according to the embodiment 1 of the present invention.

Subsequently, as shown in FIG. 10, the silicon oxide film 7 is polished, for example, by a chemical mechanical polishing (CMP) method, to flatten the surface of the silicon oxide film 7. In this polishing, a silicon nitride film 3 covering an active region is used as a stopper, so that the silicon oxide film 7 remains only inside the groove 4a. An element isolation groove 4 in which a silicon oxide film 7 is embedded is completed in this manner. Thereafter, as shown in FIG. 11, the silicon nitride film 3 covering the active region is removed by means of an etching solution such as a thermal phosphoric acid.

Sintering of the silicon oxide film 7 embedded in the groove 4a may be carried out after polishing the silicon oxide film 7 by a chemical mechanical polishing method with only the silicon oxide film 7 remaining only inside the groove 4a. In this case, the silicon oxide film 7 to be sintered is thinner than that in the case in which sintering is carried out before polishing the silicon oxide film 7, so that the sintering time period can be shortened.

When the silicon oxide film 7 is deposited on the semiconductor substrate 1 in the step described above, voids may be caused in the film when the silicon oxide film 7 is embedded in the groove 4a if the size of the groove 4a is very small. In order to avoid this, a silicon oxide film 7 having a film thickness which does not cause voids is deposited, at first, and then a polycrystal silicon film 8 is deposited on the silicon oxide film 7 by a CVD method, so that the inside of the groove 4a is completely filled with a two-layer film consisting of the silicon oxide film 7 and the polycrystal silicon film 8. In this state, prior to the step of depositing a silicon oxide film 7, a silicon nitride film 6 may be deposited thinly on the inner walls of the groove 4a and the silicon nitride film 3 by a CVD method, to restrain the silicon oxide film 5 from growing toward active regions during sintering.

Figure 13:
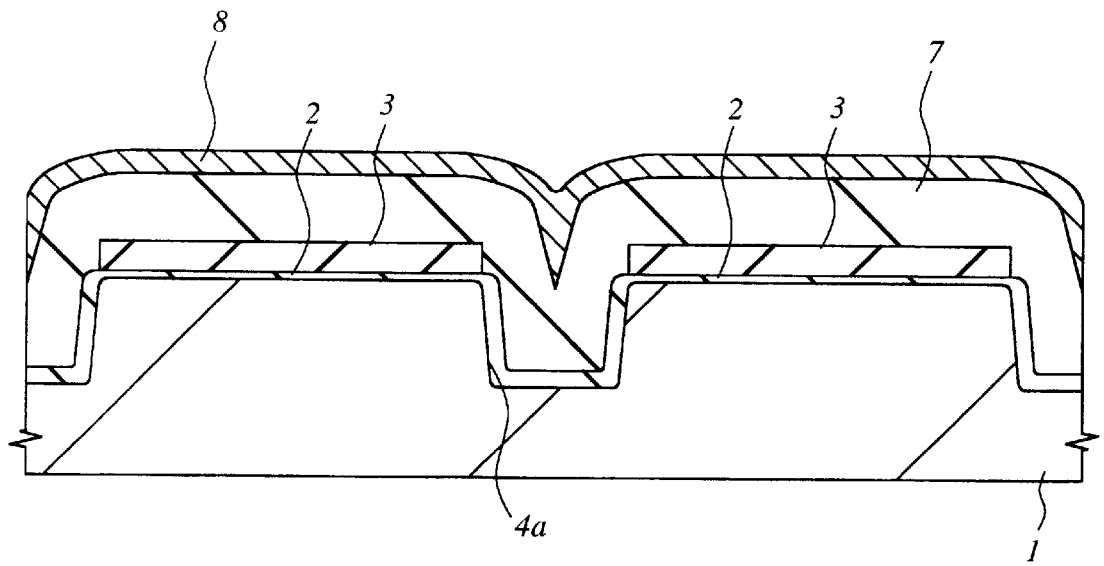
FIG. 13 is a cross-sectional view of a main part of the semiconductor substrate showing the method of manufacturing a semiconductor integrated circuit device according to the embodiment 1 of the present invention.
Figure 14:
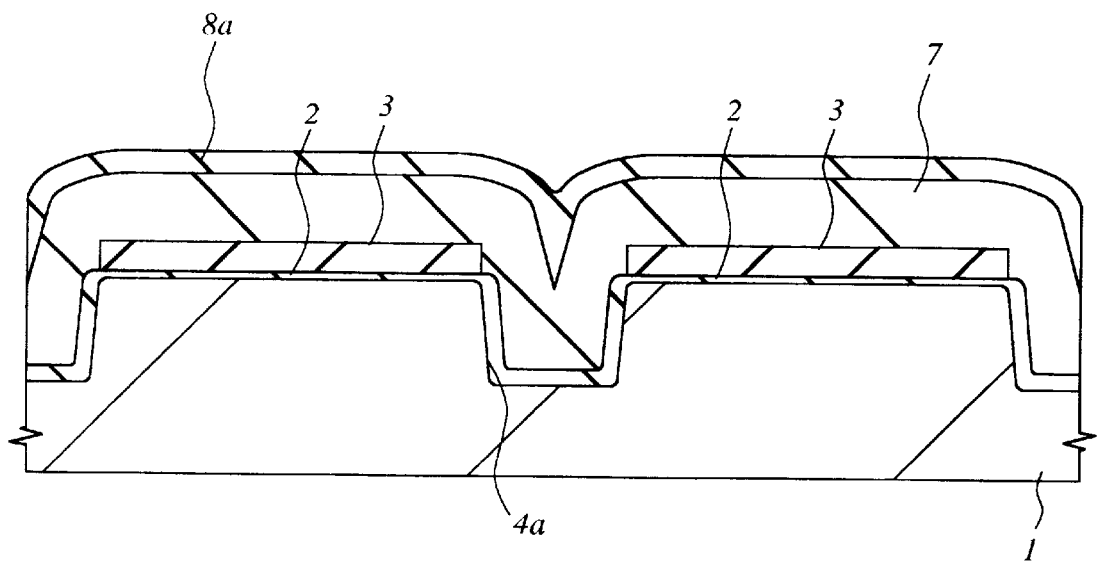
FIG. 14 is a cross-sectional view of a main part of the semiconductor substrate showing the method of manufacturing a semiconductor integrated circuit device according to the embodiment 1 of the present invention.

Next, as shown in FIG. 13, the semiconductor substrate 1 is subjected to a heat treatment under conditions described above, to sinter the silicon oxide film 7. In this step, as shown in FIG. 14, the polycrystal silicon film 8 on the silicon oxide film 7 is thermally oxidized and changed into a silicon oxide film 8a.

Figure 15:
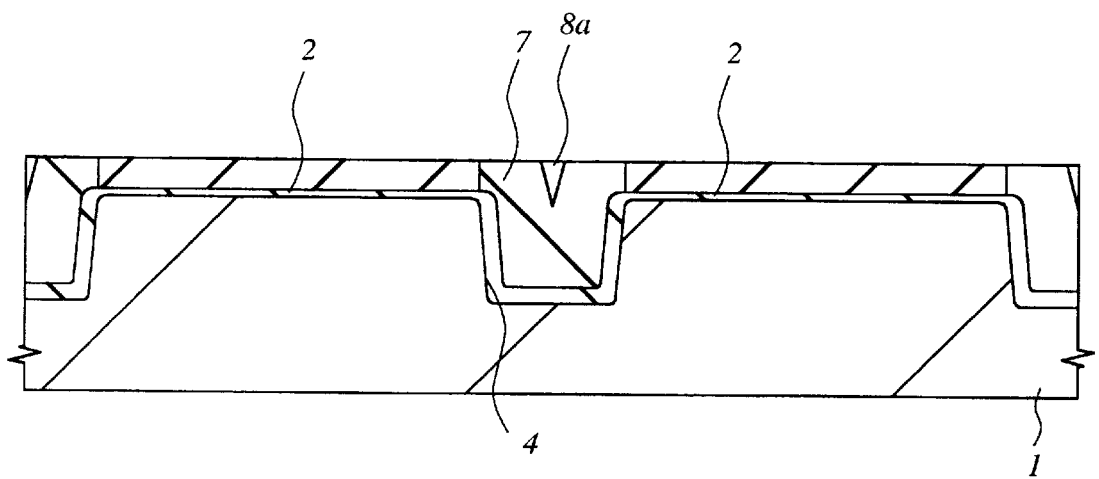
FIG. 15 is a cross-sectional view of a main part of the semiconductor substrate showing the method of manufacturing a semiconductor integrated circuit device according to the embodiment 1 of the present invention.

Thereafter, as shown in FIG. 15, the silicon oxide film 8a and the silicon oxide film 7 are polished to obtain an element isolation groove 4 without voids.

Next, a complementary MISFET is formed at an active region of the semiconductor substrate 1, whose periphery is defined by the above-described element isolation grooves 4, by a method as follow.

Figure 16:
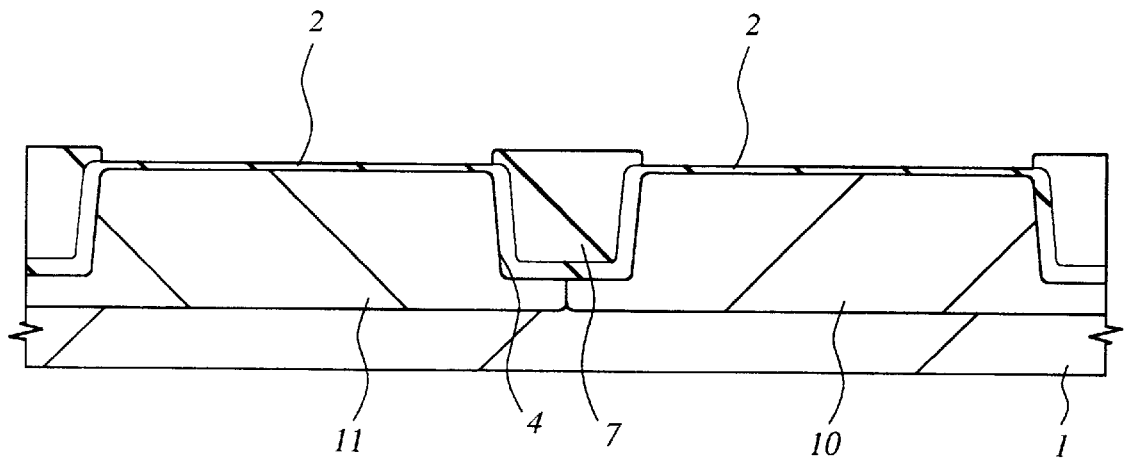
FIG. 16 is a cross-sectional view of a main part of the semiconductor substrate showing the method of manufacturing a semiconductor integrated circuit device according to the embodiment 1 of the present invention.

At first, a silicon oxide film (or pad oxide film) 2 remaining on the surface of an active region is removed with use of a hydrofluoric acid solution or the like, and thereafter the semiconductor substrate 1 is thermally oxidized at a temperature of 800 to 850° C. to form a clean gate oxide film 9 on the surface of the semiconductor substrate 1, as shown in FIG. 16. In this state, since the shoulder portions of the element isolation groove 4 are rounded, it is possible to prevent a problem that the gate oxide film 9 is thinned above the shoulder portions.

Figure 17:
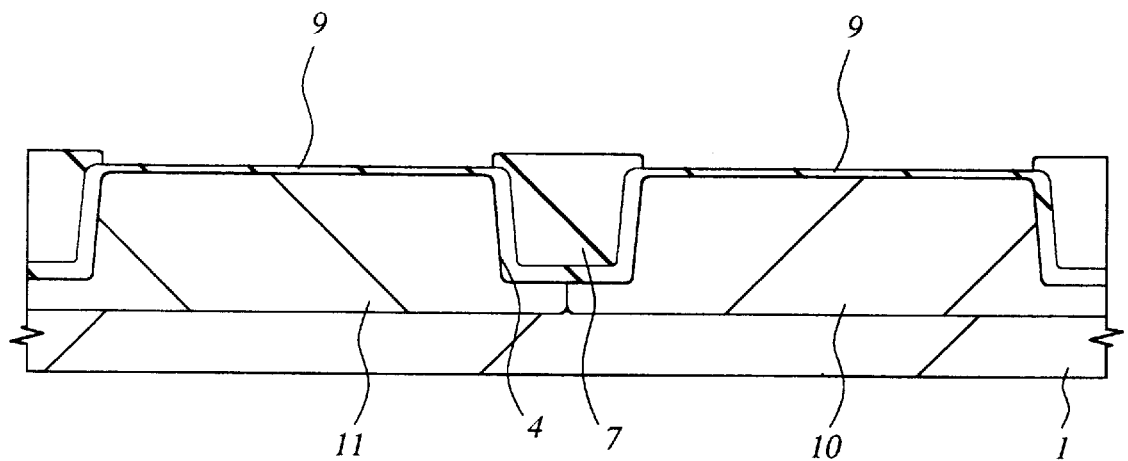
FIG. 17 is a cross-sectional view of a main part of the semiconductor substrate showing the method of manufacturing a semiconductor integrated circuit device according to the embodiment 1 of the present invention.

Next, as shown in FIG. 17, n-type impurities such as P (phosphorus) are ion-implanted into a part of the semiconductor substrate 1, and p-type impurities such as B (boron) are ion-implanted into another part thereof. Thereafter, the semiconductor substrate 1 is subjected to a heat treatment at a temperature of 1000° C. or less, e.g., 950° C., thereby to expand and diffuse the two kinds of impurities described above. In this manner, a p-type well 10 is formed in a region where an n-channel type MISFET is formed, and an n-type well 11 is formed in a region where a p-channel type MISFET is formed. The gate oxide film 9 may be formed on the surfaces of the p-type well 10 and the n-type well 11 after these wells are formed.

Figure 18:
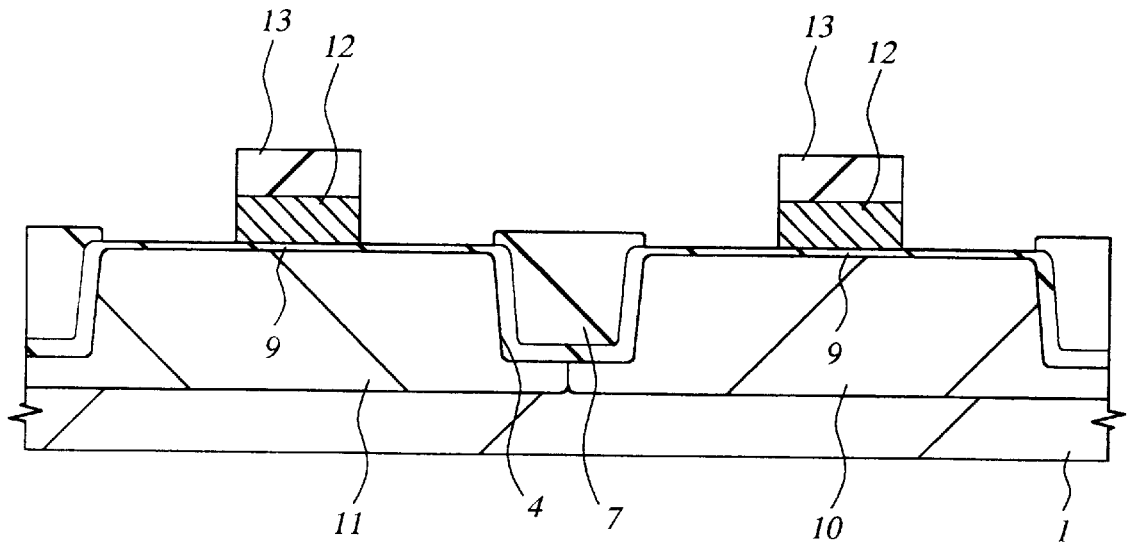
FIG. 18 is a cross-sectional view of a main part of the semiconductor substrate showing the method of manufacturing a semiconductor integrated circuit device according to the embodiment 1 of the present invention.

Next, as shown in FIG. 18, a gate electrode 12 of the n-channel type MISFET is formed above the p-type well 10, and a gate electrode 12 of the p-channel type MISFET is formed above the n-type well 11. To form the gate electrode 12, a P-doped polycrystal silicon film by a CVD method, a W (tungsten) silicide film, and a cap insulating film 13, for example, are deposited on the semiconductor substrate 1, and thereafter these films are patterned by etching with a photoresist used as a mask. The cap insulating film 13 is made of a silicon oxide film or a silicon nitride film.

Figure 19:
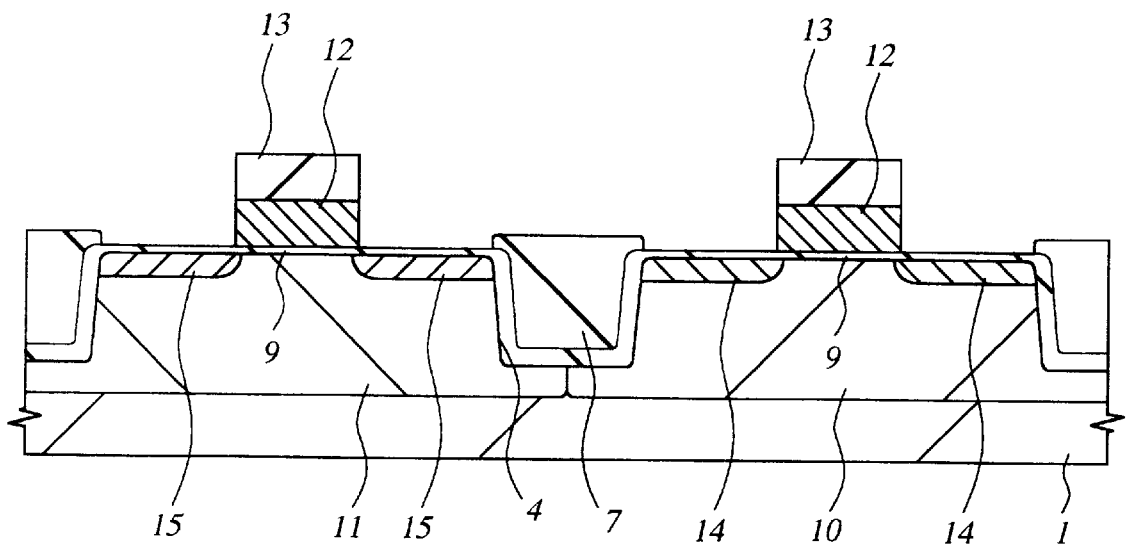
FIG. 19 is a cross-sectional view of a main part of the semiconductor substrate showing the method of manufacturing a semiconductor integrated circuit device according to the embodiment 1 of the present invention.

Next, as shown in FIG. 19, n-type impurities such P or the like are ion-implanted into the p-type well 10 to form n-type semiconductor regions (or source and drain) 14 of the n-channel type MISFET, and p-type impurities such as B (boron) or the like are ion-implanted into the n-type well 11 to form p-type semiconductor regions (or source and drain) 15. Thus, a n-channel type MISFET Qn and a p-channel type MISFET Qp are obtained.

Figure 20:
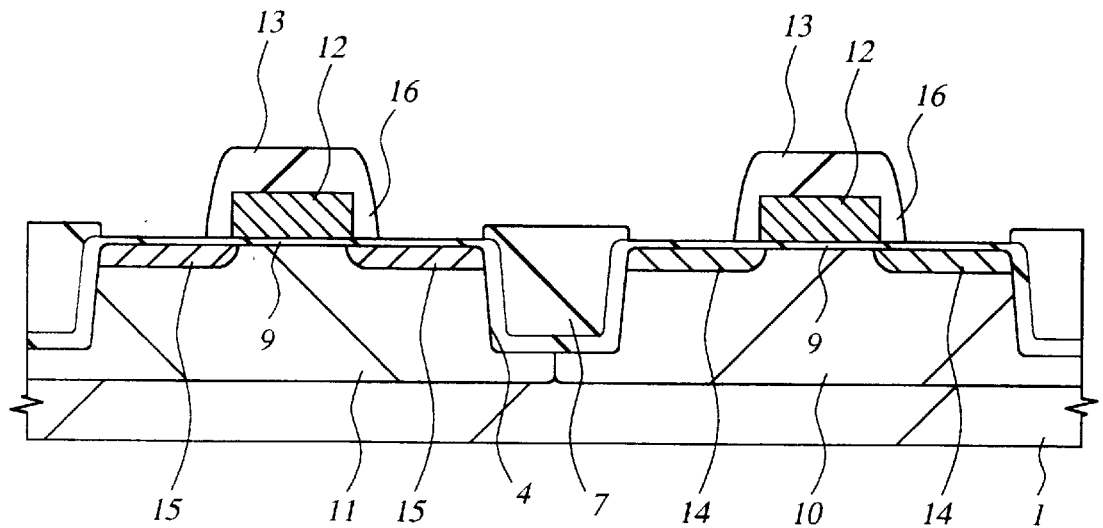
FIG. 20 is a cross-sectional view of a main part of the semiconductor substrate showing the method of manufacturing a semiconductor integrated circuit device according to the embodiment 1 of the present invention.

Next, as shown in FIG. 20, side wall spacers 16 are formed on the side walls of the gate electrodes 12. The side wall spacers 16 are formed by depositing a silicon oxide film or a silicon nitride film on the semiconductor substrate 1 by a CVD method and by further patterning this film by anisotropic etching.

Figure 21:
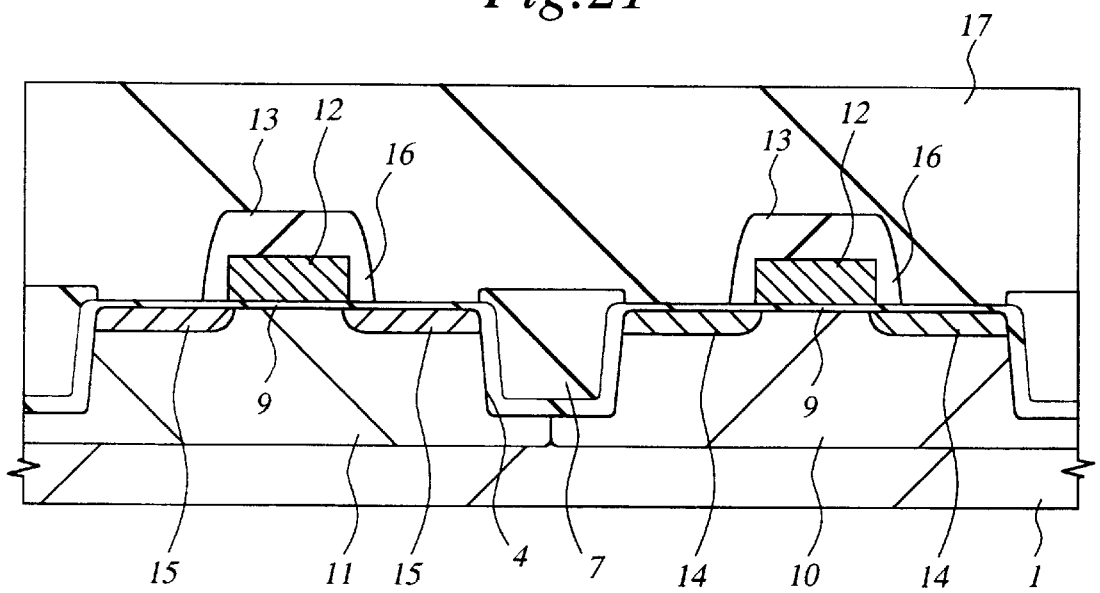
FIG. 21 is a cross-sectional view of a main part of the semiconductor substrate showing the method of manufacturing a semiconductor integrated circuit device according to the embodiment 1 of the present invention.
Figure 22:
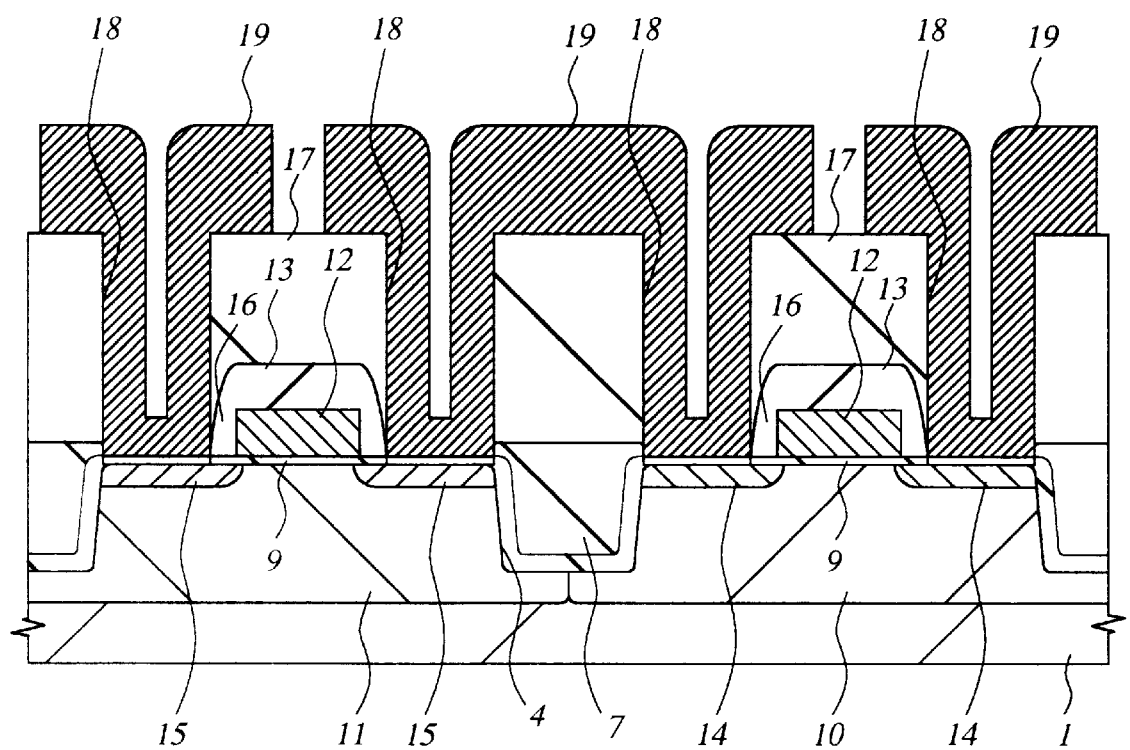
FIG. 22 is a cross-sectional view of a main part of the semiconductor substrate showing the method of manufacturing a semiconductor integrated circuit device according to the embodiment 1 of the present invention.

Subsequently, as shown in FIG. 21, a silicon oxide film 17 is deposited on the semiconductor substrate 1 by a CVD method. Thereafter, as shown in FIG. 22, contact holes 18 are formed on the portions of the silicon oxide film 17 which are positioned above the n-type semiconductor regions (or source and drain) 14 of the n-channel type MISFET Qn and above the p-type semiconductor regions (or source and drain) 15 of the p-channel type MISFET Qp. Subsequently, an Al (aluminum) alloy film deposited on the silicon oxide film 17 by a spattering method is patterned to form wires 19.

Embodiment 2

A method of forming an element isolation groove 4 according to the present embodiment will be explained with reference to FIGS. 23 to 26.

Figure 23:
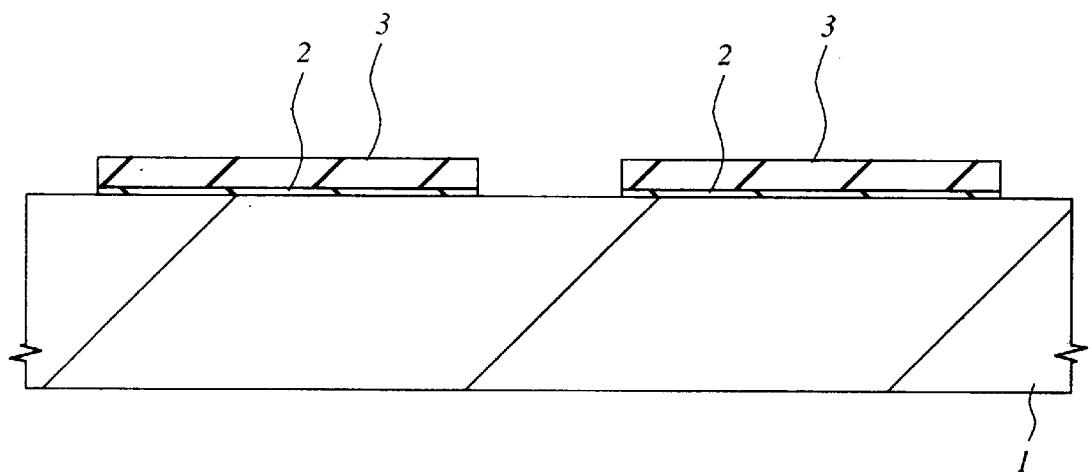
FIG. 23 is a cross-sectional view of a main part of a semiconductor substrate showing a method of manufacturing a semiconductor integrated circuit device according to an embodiment 2 of the present invention.

At first, as shown in FIG. 23, a semiconductor substrate 1 is thermally oxidized at 800 to 850° C. to form a silicon oxide film (or pad oxide film) 2 on the main surface of the semiconductor substrate 1. Thereafter, a silicon nitride film 3 is deposited on the silicon oxide film 2 by a CVD method. Subsequently, the silicon nitride film 3 and the silicon oxide film 2 at an element isolation region are removed by etching with a photoresist used as a mask.

Figure 24:
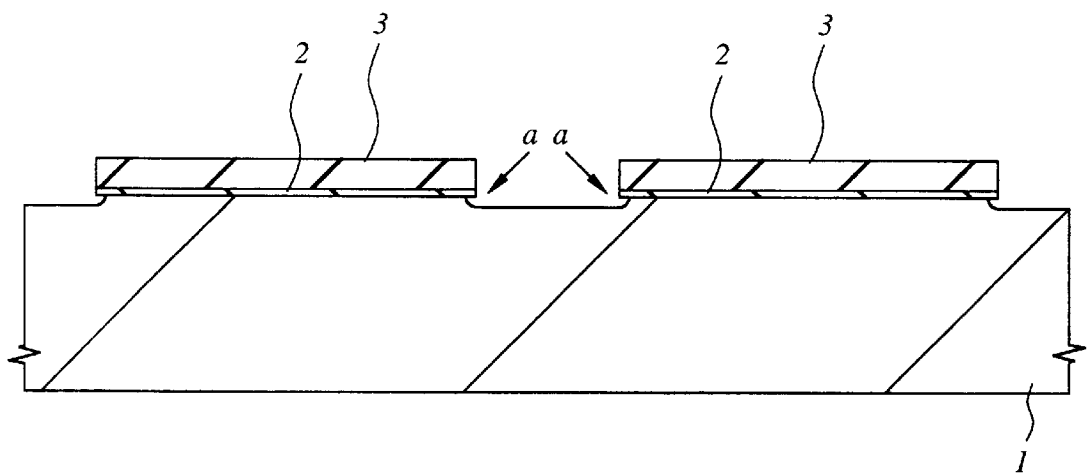
FIG. 24 is a cross-sectional view of a main part of the semiconductor substrate showing the method of manufacturing a semiconductor integrated circuit device according to the embodiment 2 of the present invention.

Next, as shown in FIG. 24, the surface of the semiconductor substrate 1 at the element isolation region is shallowly and isotropically etched to form undercuts (a) in the semiconductor substrate 1 at end portions of the element isolation region.

Figure 25:
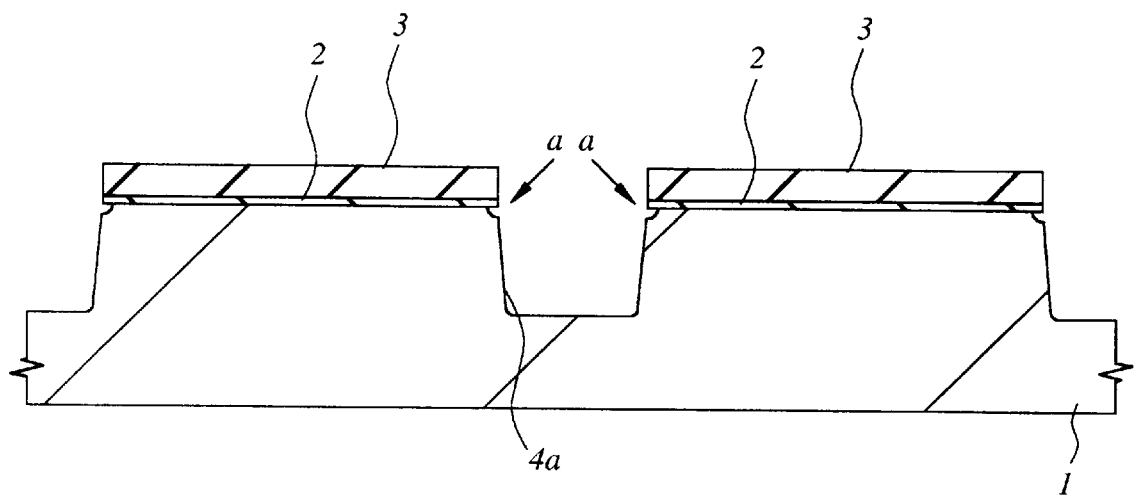
FIG. 25 is a cross-sectional view of a main part of the semiconductor substrate showing the method of manufacturing a semiconductor integrated circuit device according to the embodiment 2 of the present invention.
Figure 26:
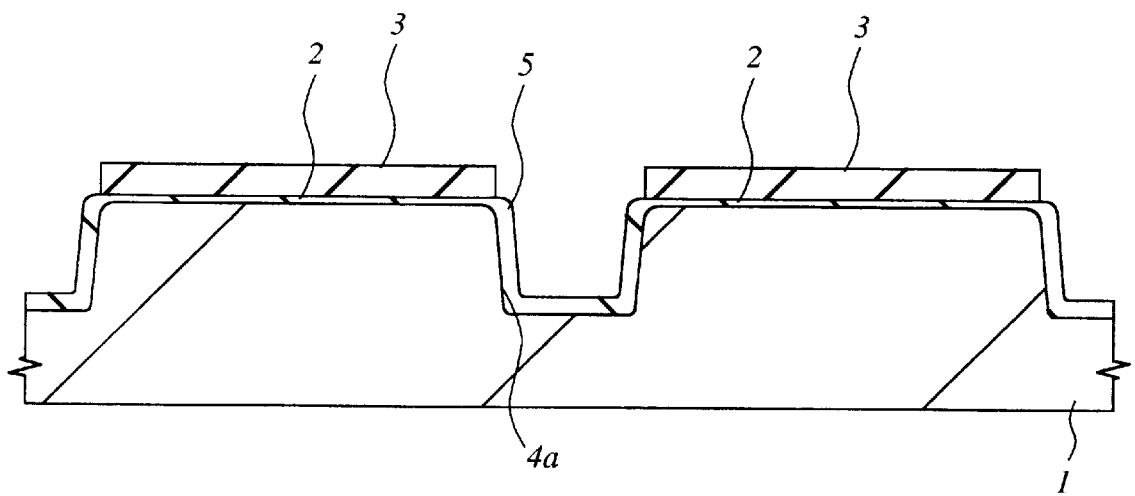
FIG. 26 is a cross-sectional view of a main part of the semiconductor substrate showing the method of manufacturing a semiconductor integrated circuit device according to the embodiment 2 of the present invention.

Subsequently, as shown in FIG. 25, the semiconductor substrate 1 at the element isolation region is anisotropically etched with an etching gas by changing its composition, to form a groove 4a in the semiconductor substrate 1 at the element isolation region. Next, as shown in FIG. 26, the semiconductor substrate 1 is thermally oxidized at 950° C., for example, to form a silicon oxide film 5 on the inner walls of the groove 4a and to simultaneously round shoulder portions of the groove 4a. The subsequent steps are the same as those in the embodiment 1.

According to the present embodiment, since the undercuts are formed at the shoulder portions of the groove 4a prior to a step of forming a silicon oxide film 5 on the inner wall of the groove 4a, the shoulder portions of the groove 4a can be easily rounded without displacing the portions of the silicon oxide film 2 which are exposed from the side walls of the groove 4a, toward active regions. Note that it is possible to adopt both the method of the embodiment 1 in which the portions of the silicon oxide film 2 exposed from the side walls of the groove 4a are displaced toward active regions and the method of the present embodiment in which the undercuts are formed at the shoulder portions of the groove 4a.

Embodiment 3

A method of forming an element isolation groove 4 according to the present embodiment will be explained with reference to FIGS. 27 to 34.

Figure 27:
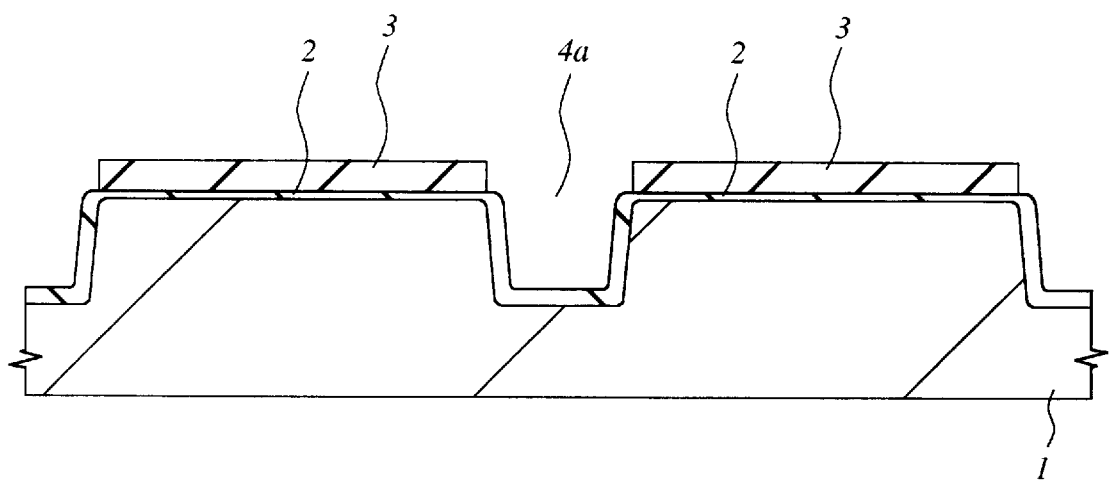
FIG. 27 is a cross-sectional view of a main part of a semiconductor substrate showing a method of manufacturing a semiconductor integrated circuit device according to an embodiment 3 of the present invention.
Figure 28:
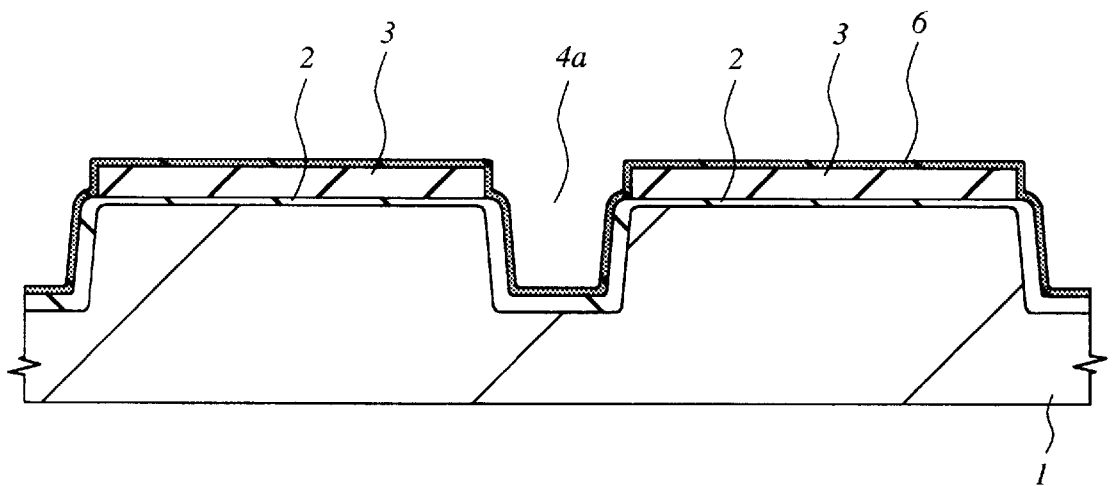
FIG. 28 is a cross-sectional view of a main part of the semiconductor substrate showing the method of manufacturing a semiconductor integrated circuit device according to the embodiment 3 of the present invention.

At first, as shown in FIG. 27, a silicon oxide film 5 is formed on the inner walls of the groove 4a and shoulder portions of the groove 4a are rounded by a method according to the embodiment 1 or 2. Thereafter, as shown in FIG. 28, a silicon nitride film 6 is thinly deposited on a semiconductor substrate 1 by a CVD method. The silicon nitride film 6 is formed for the purpose of restraining the silicon oxide film 5 on the inner wall of the groove 4a from growing toward active regions when sintering the silicon oxide film 7 embedded in the groove 4a in a later step.

Figure 29:
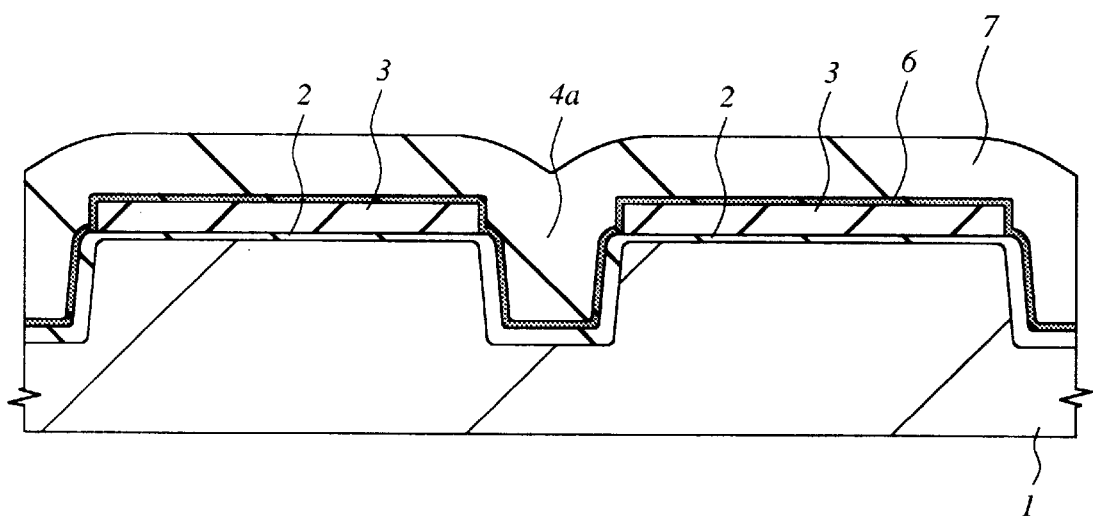
FIG. 29 is a cross-sectional view of a main part of the semiconductor substrate showing the method of manufacturing a semiconductor integrated circuit device according to the embodiment 3 of the present invention.

Next, as shown in FIG. 29, a silicon oxide film 7 is deposited on the semiconductor substrate 1 by a CVD method, and the silicon oxide film 7 is embedded in the groove 4a. Thereafter, the semiconductor substrate 1 is wet-oxidized under the temperature conditions described above, thereby carrying out sintering for improving the film quality of the silicon oxide film 7 embedded in the groove 4a.

Figure 30:
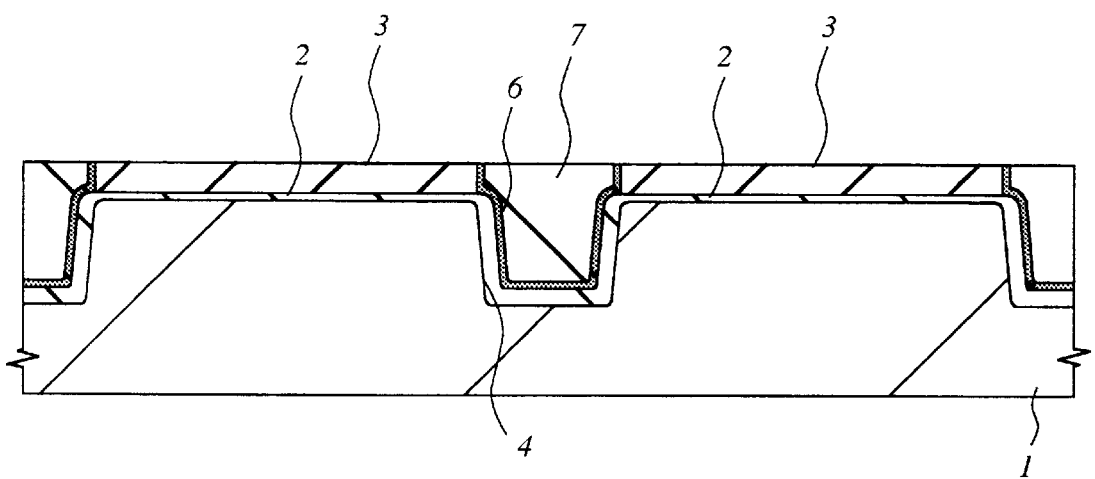
FIG. 30 is a cross-sectional view of a main part of the semiconductor substrate showing the method of manufacturing a semiconductor integrated circuit device according to the embodiment 3 of the present invention.
Figure 31:
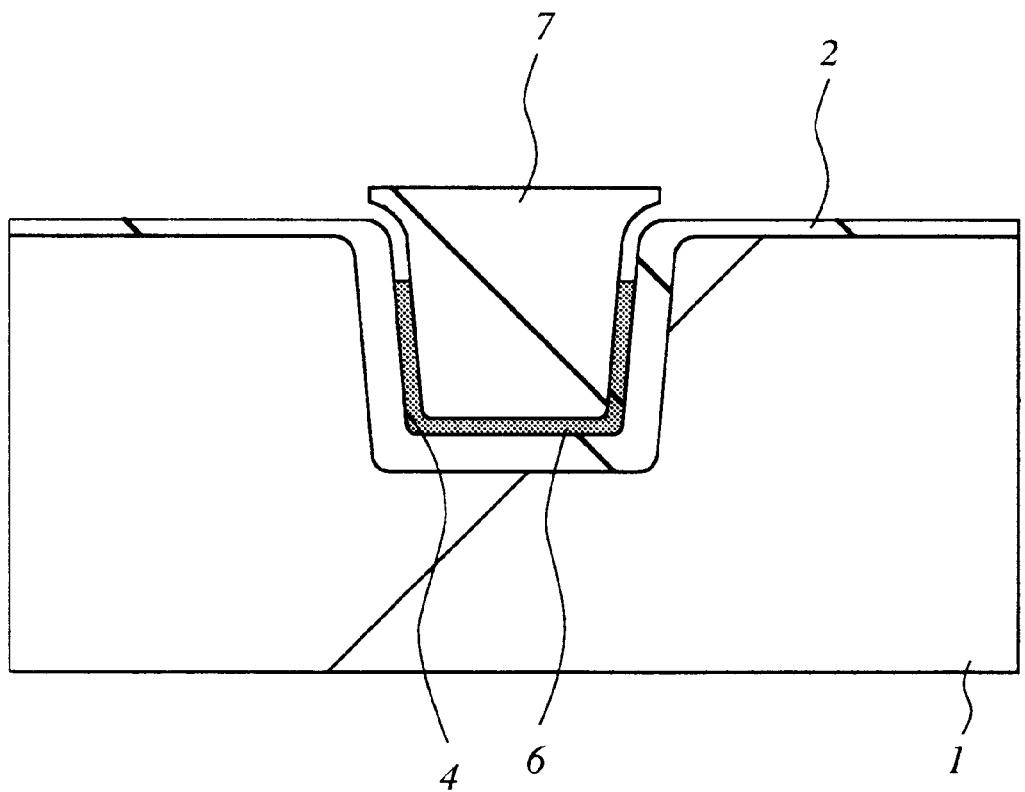
FIG. 31 is a cross-sectional view of a main part of the semiconductor substrate showing the method of manufacturing a semiconductor integrated circuit device according to the embodiment 3 of the present invention.

Subsequently, as shown in FIG. 30, a chemical mechanical polishing method is used to polish the silicon oxide film 7 so that the silicon oxide film 7 remains only in the groove 4a, thereby to form an element isolation groove 4. Thereafter, as shown in FIG. 31, the silicon nitride film 6 on the inner walls of the element isolation groove 4 is etched simultaneously when removing the silicon nitride film 3 covering active regions by means of an etching solution such as a thermal phosphorus acid or the like. Therefore, the silicon nitride film 6 is recessed inwards into the element isolation groove 4, and recesses are formed at the shoulder portions of the element isolation groove 4. If the recesses are formed, the surface of the silicon oxide film 7 embedded in the element isolation groove 4 may be broken into foreign substances or etching residues may be created in the recesses after etching a gate electrode material such as polycrystal silicon or the like to be deposited in a later step.

Figure 32:
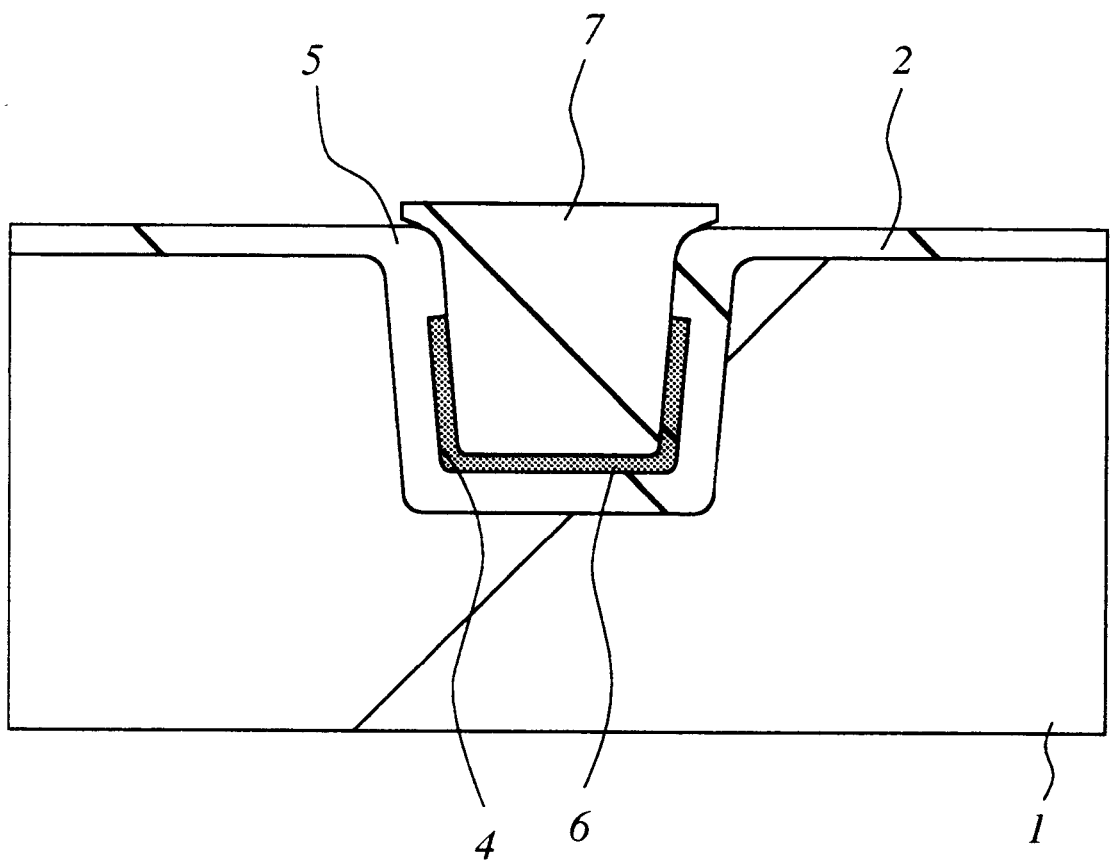
FIG. 32 is a cross-sectional view of a main part of the semiconductor substrate showing the method of manufacturing a semiconductor integrated circuit device according to the embodiment 3 of the present invention.

To avoid these drawbacks, for example, the silicon oxide film 7 at the shoulder portions of the element isolation groove 4 is oxidized again at a temperature of 850 to 900° C. to be thickened so that the recesses are covered by the silicon oxide film 7, after removing the silicon nitride film 3, as shown in FIG. 32. To cover the recesses with the silicon oxide film 7, the film thickness must be increased to be at least more than twice the film thickness of the silicon nitride film 6. However, if the increase is too large, active regions are narrowed by the silicon oxide film 5 which has grown. Therefore, the oxidation period must be controlled such that the film thickness is increased to be twice or slightly more the film thickness of the silicon nitride film 6.

Figure 33:
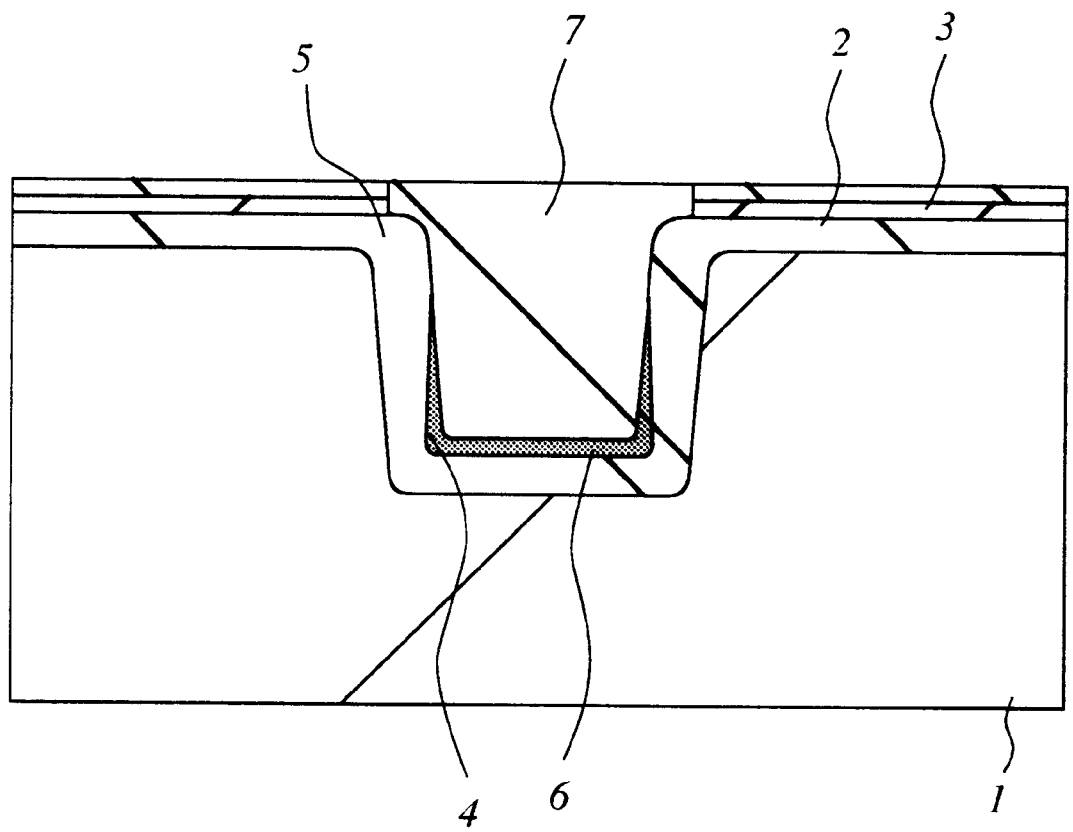
FIG. 33 is a cross-sectional view of a main part of the semiconductor substrate showing the method of manufacturing a semiconductor integrated circuit device according to the embodiment 3 of the present invention.
Figure 34:
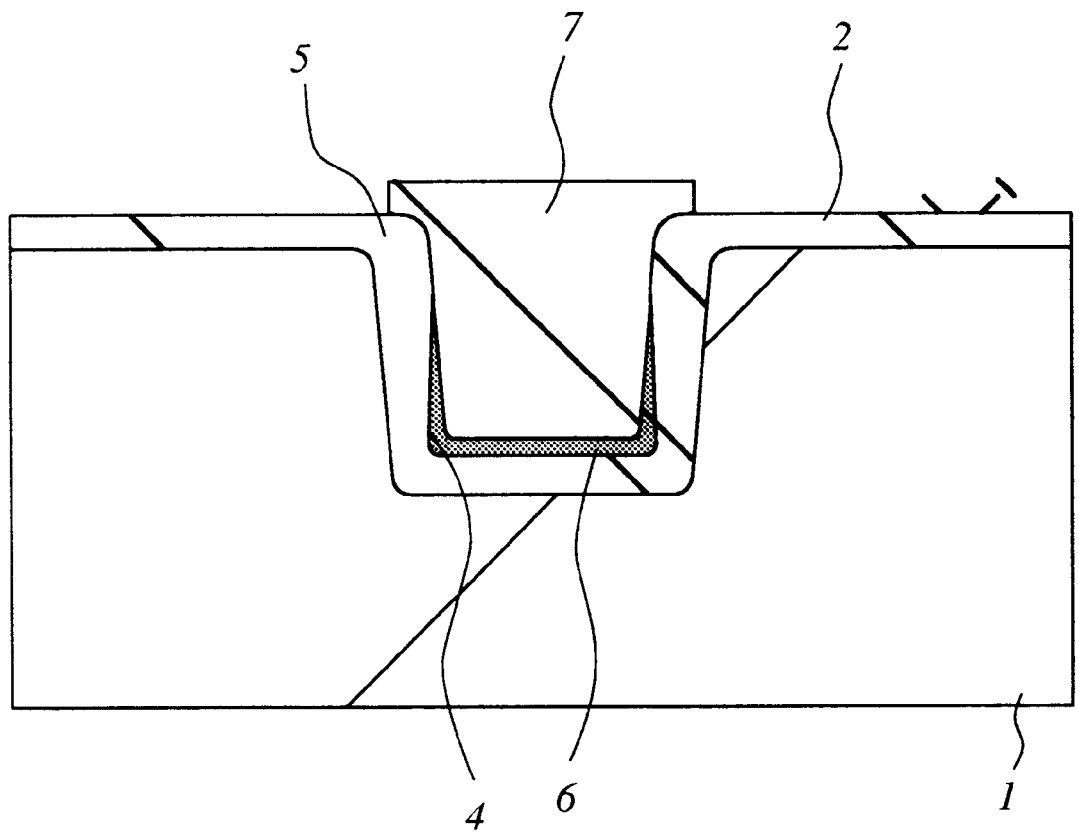
FIG. 34 is a cross-sectional view of a main part of the semiconductor substrate showing the method of manufacturing a semiconductor integrated circuit device according to the embodiment 3 of the present invention.

Another method of preventing recesses from being formed at the shoulder portions of the element isolation groove 4 will be as follows. As shown in FIG. 33, the silicon oxide film 7 is polished by a chemical mechanical polishing method so that the silicon oxide film 7 remains only inside the groove 4a, and thereafter sintering is carried out. In this state, the surface of the silicon nitride film 3 covering active regions and the silicon nitride film 6 in the vicinity of the shoulder portions of the element isolation groove 4 are oxidized by setting a little bit long sintering period (or a little bit high sintering temperature). Thereafter, the oxide film on the surface of the silicon nitride film 3 is removed by etching, and subsequently the silicon nitride film 3 is removed by etching. In this manner, it is possible to prevent recesses from being formed at the shoulder portions of the element isolation groove 4.

Embodiment 4

A method of forming an element isolation groove 4 according to the present embodiment will be explained with reference to FIGS. 35 and 36.

Figure 35:
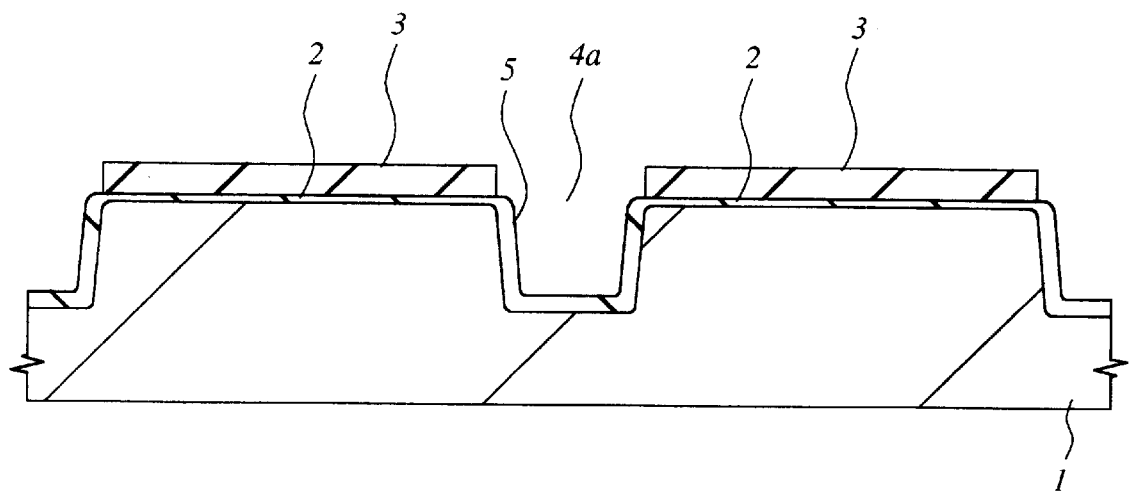
FIG. 35 is a cross-sectional view of a main part of a semiconductor substrate showing a method of manufacturing a semiconductor integrated circuit device according to an embodiment 4 of the present invention.
Figure 36:
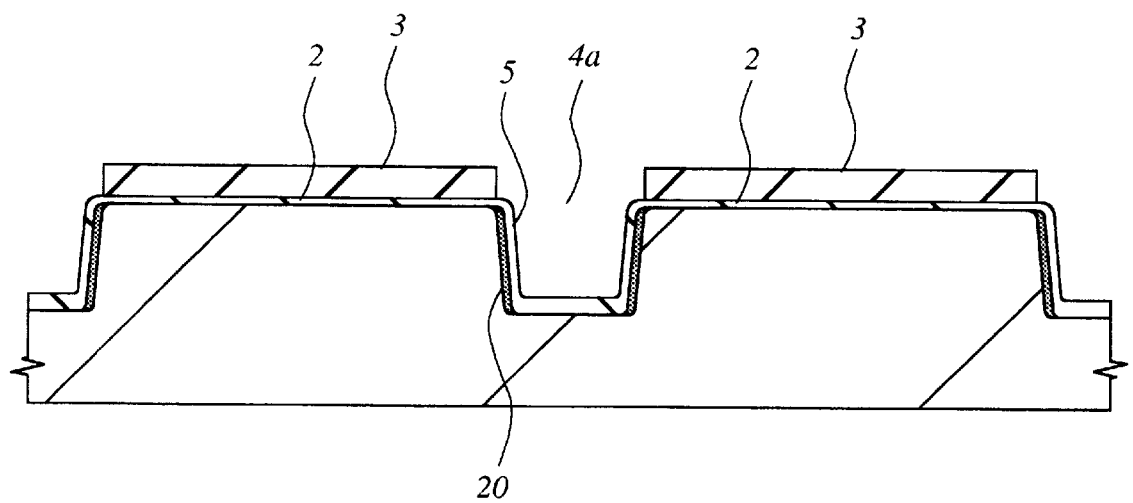
FIG. 36 is a cross-sectional view of a main part of the semiconductor substrate showing the method of manufacturing a semiconductor integrated circuit device according to the embodiment 4 of the present invention.

At first, as shown in FIG. 35, a silicon oxide film 5 is formed on the inner walls of the groove 4a and shoulder portions of the groove 4a are rounded in a manner as described before. Thereafter, as shown in FIG. 36, the inner walls of the groove 4a are subjected to oxidation/nitriding processing to segregate nitrogen to the vicinity of the interface between the silicon oxide film 5 formed on the inner walls of the groove 4a and the side walls of the element isolation regions, thereby to form silicon nitride layers 20.

To subject the inner walls of the groove 4a to the oxidation/nitriding processing, a semiconductor substrate 1 is subjected to a heat treatment in a NO (nitrogen oxide) or $N_2O$ (nitrogen oxide) atmosphere. In this state, nitrogen generated by thermal decomposition of NO or $N_2O$ is segregated to the vicinity of the interface between the silicon oxide film 5 and the element isolation regions of the semiconductor substrate 1, and thereafter the heat treatment is carried out to form silicon nitride layers 20.

According to the present embodiment, since silicon nitride layers 20 are formed in the vicinity of the interface between the silicon oxide film 5 and the element isolation regions of the semiconductor substrate 1, the vicinity of the interface is difficult to be oxidized when sintering the silicon oxide film 7 embedded in the groove 4a later, and therefore it is possible to restrain the silicon oxide film 5 from growing toward active regions.

Figure 37:
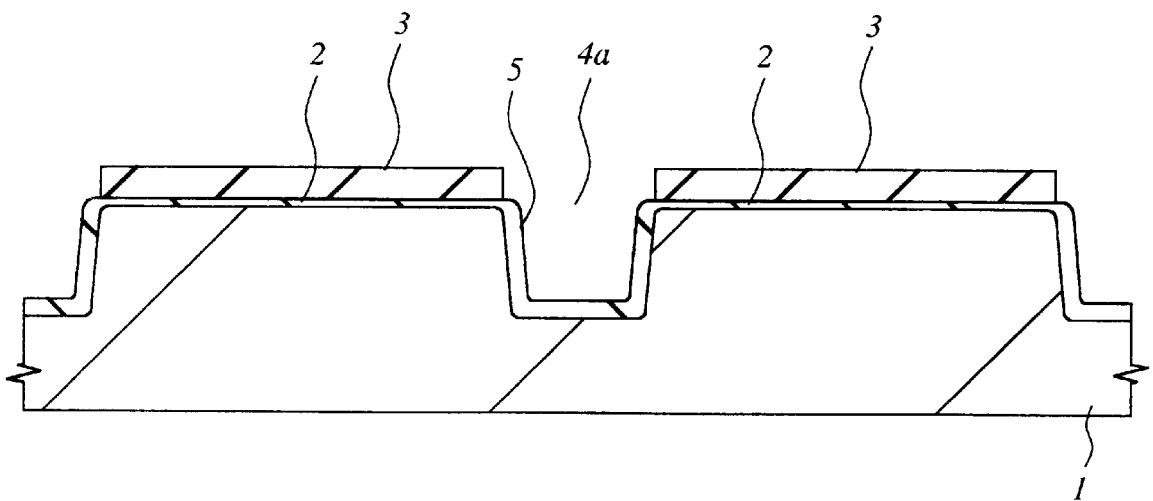
FIG. 37 is a cross-sectional view of a main part of the semiconductor substrate showing the method of manufacturing a semiconductor integrated circuit device according to the embodiment 4 of the present invention.
Figure 38:
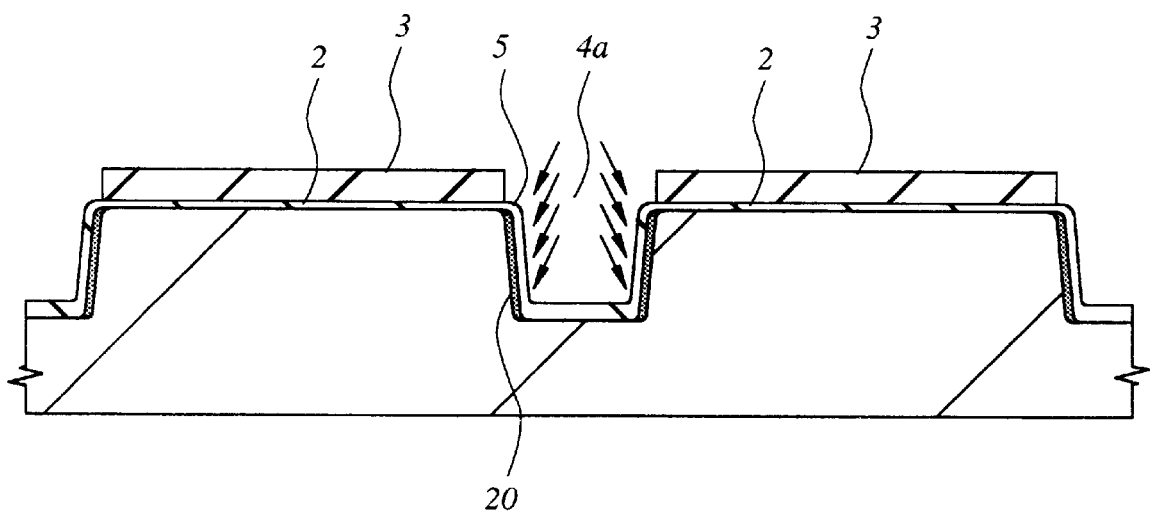
FIG. 38 is a cross-sectional view of a main part of the semiconductor substrate showing the method of manufacturing a semiconductor integrated circuit device according to the embodiment 4 of the present invention.

Another method of forming silicon nitride layers 20 in the vicinity of the interface between the silicon oxide film 5 and active regions of the semiconductor substrate 1 is as follows. As shown in FIG. 37, a silicon oxide film 5 is formed on the inner walls of the groove 4a and the shoulder portions of the groove 4a are rounded, in a manner as described before. Thereafter, as shown in FIG. 38, nitrogen is ion-implanted to the vicinity of the interface between the silicon oxide film 5 and active regions of the semiconductor substrate 1, and a heat treatment is carried out.

Embodiment 5

A method of forming an element isolation groove 4 according to the present embodiment will be explained with reference to FIGS. 39 and 40.

Figure 39:
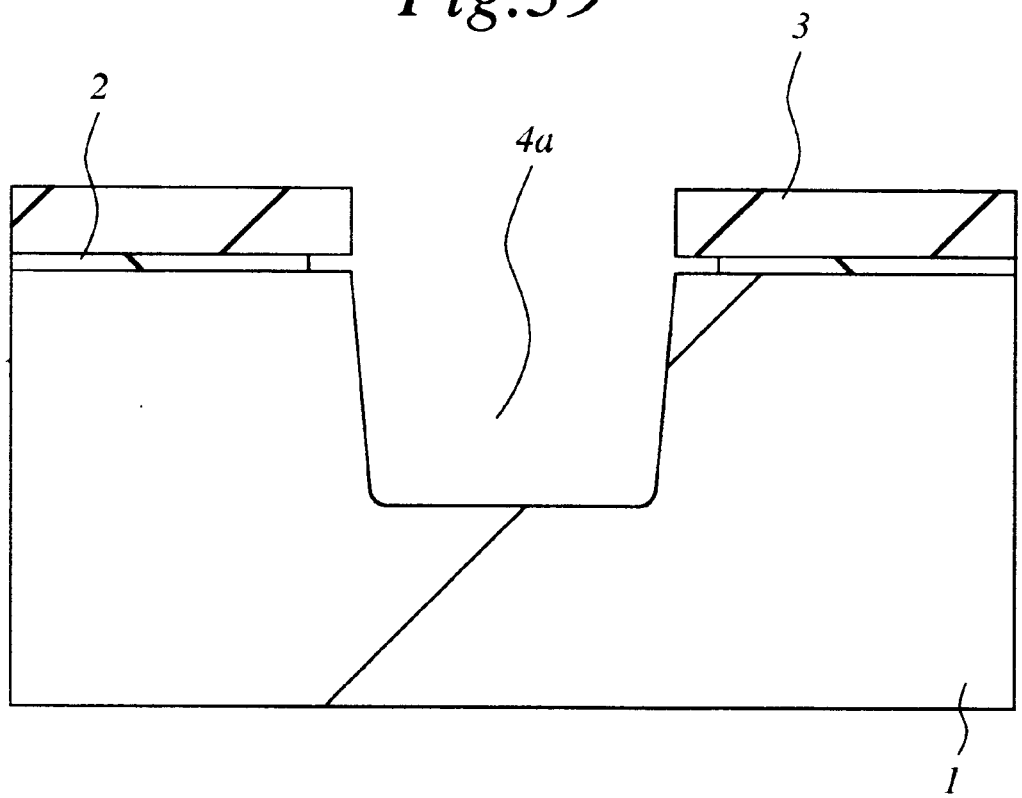
FIG. 39 is a cross-sectional view of a main part of a semiconductor substrate showing a method of manufacturing a semiconductor integrated circuit device according to an embodiment 5 of the present invention.

At first, as shown in FIG. 39, a groove 4a is formed in a semiconductor substrate 1 at an element isolation region by etching with a silicon nitride film 3 used as a mask. Thereafter, the portions of the silicon oxide film 2 which are exposed from the side walls of the groove 4a are removed by means of an etching solution containing hydrofluoric acid to displace the silicon oxide film 2 backward toward the active regions. The steps taken up to this state are the same as those in the embodiment 1.

Figure 40:
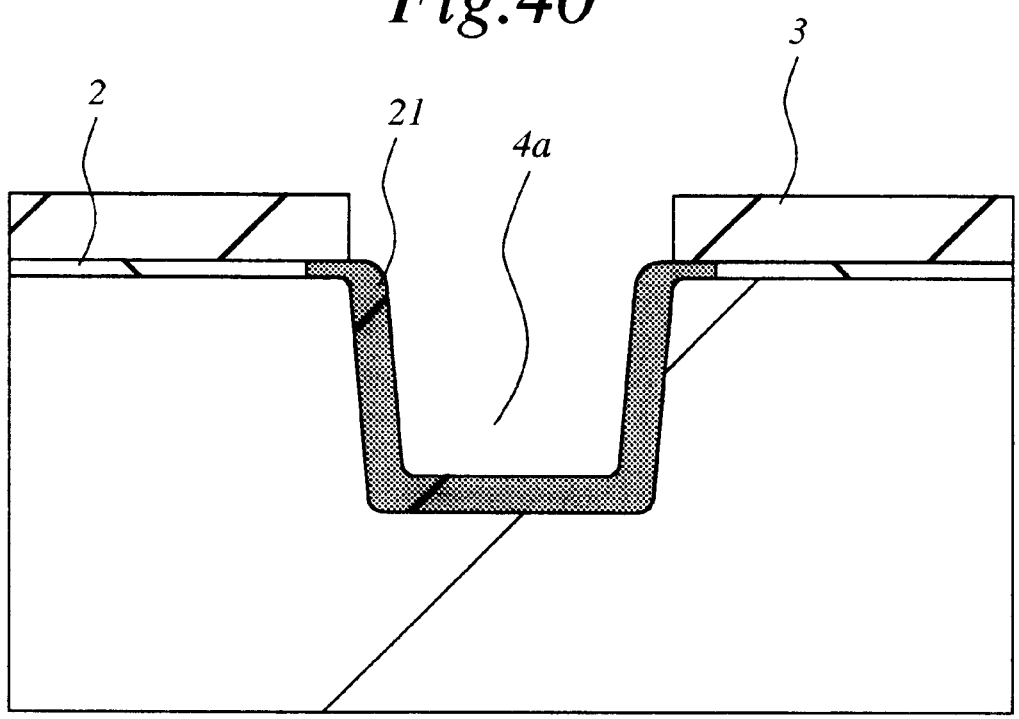
FIG. 40 is a cross-sectional view of a main part of the semiconductor substrate showing the method of manufacturing a semiconductor integrated circuit device according to the embodiment 5 of the present invention.

Next, as shown in FIG. 40, the semiconductor substrate 1 is subjected to oxidation/nitriding processing to form a silicon nitride film 21 on the inner walls of the groove 4a and shoulder portions of the groove 4a are rounded. To subject the semiconductor substrate 1 to oxidation/nitriding processing, the semiconductor substrate 1 is subjected to a heat treatment at about 900° C. in a mixed atmosphere of NO and $N_2$, for example. Otherwise, the semiconductor substrate 1 is subjected to a heat treatment at about 1050° C. in a mixed atmosphere of $N_2O$ and $N_2$.

According to the present embodiment, since a silicon nitride film 21 is formed on the inner walls of the groove 4a, the vicinity of the above-described interface is difficult to be oxidized when sintering the silicon oxide film 7 embedded in the groove 4a later, and therefore it is possible to restrain the silicon oxide film 5 from growing toward active regions.

Embodiment 6

A method of forming an element isolation groove 4 according to the present embodiment will be explained with reference to FIGS. 41 to 44.

Figure 41:
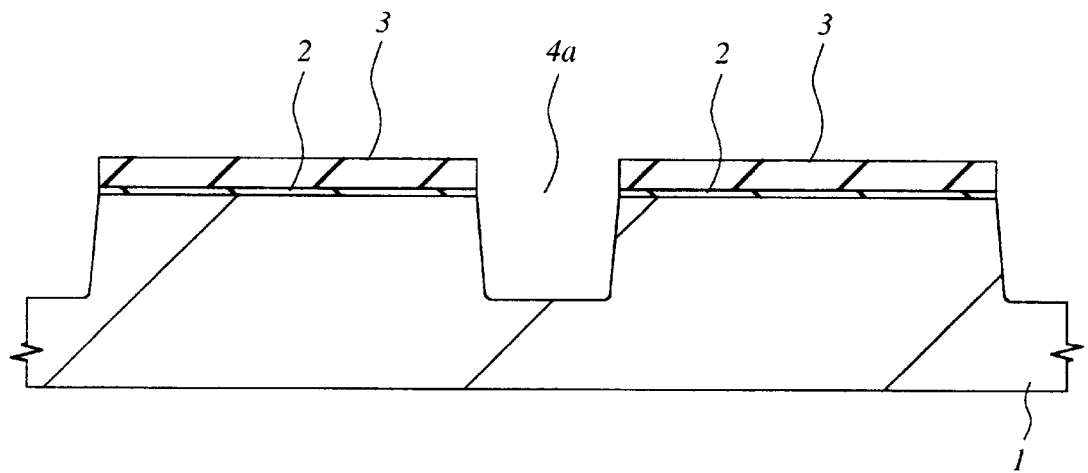
FIG. 41 is a cross-sectional view of a main part of a semiconductor substrate showing a method of manufacturing a semiconductor integrated circuit device according to an embodiment 6 of the present invention.
Figure 42:
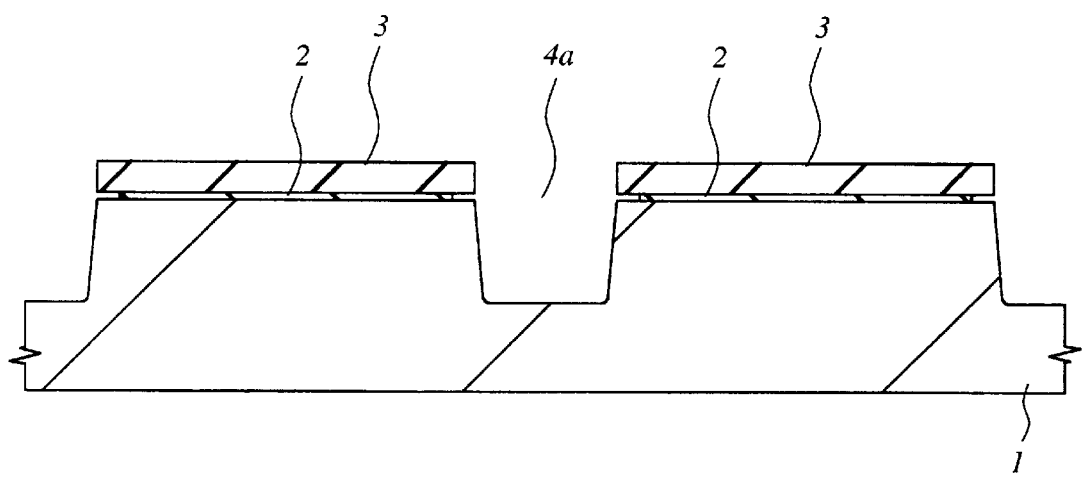
FIG. 42 is a cross-sectional view of a main part of the semiconductor substrate showing the method of manufacturing a semiconductor integrated circuit device according to the embodiment 6 of the present invention.

At first, as shown in FIG. 41, a groove 4a is formed in a semiconductor substrate 1 at an element isolation region by etching with a silicon nitride film 3 used as a mask. Thereafter, as shown in FIG. 42, the portions of the silicon oxide film 2 which are exposed from the side walls of the groove 4a are removed by means of an etching solution containing hydrofluoric acid to displace the silicon oxide film 2 backward toward the active regions. The steps taken up to this state are the same as those in the embodiment 1.

Figure 43:
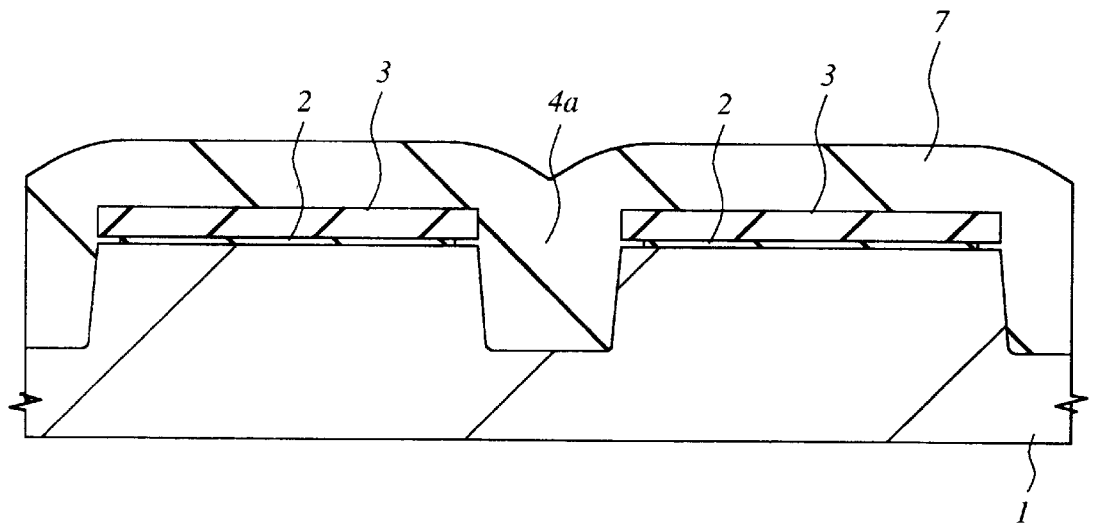
FIG. 43 is a cross-sectional view of a main part of the semiconductor substrate showing the method of manufacturing a semiconductor integrated circuit device according to the embodiment 6 of the present invention.
Figure 44:
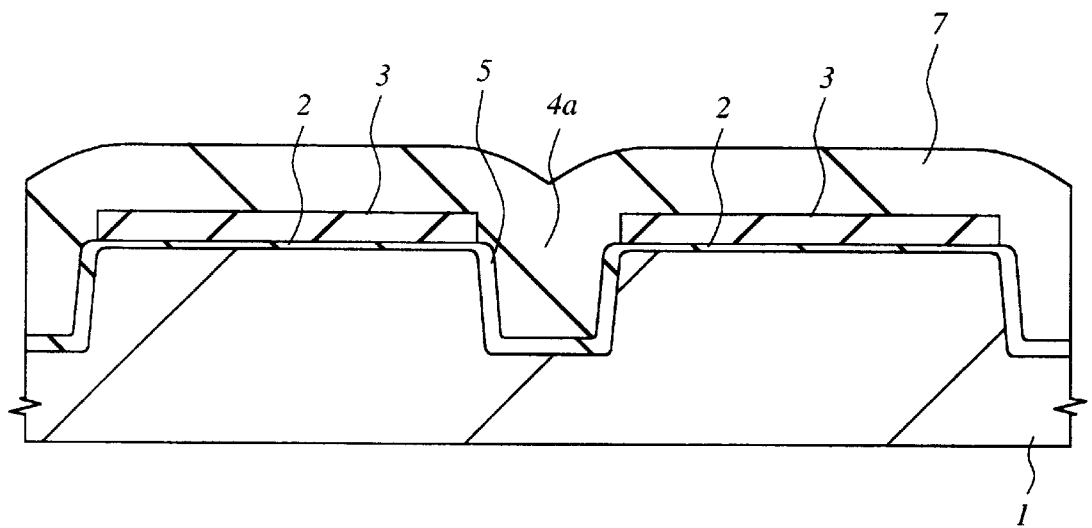
FIG. 44 is a cross-sectional view of a main part of the semiconductor substrate showing the method of manufacturing a semiconductor integrated circuit device according to the embodiment 6 of the present invention.

Next, as shown in FIG. 43, a silicon oxide film 7 is deposited on the semiconductor substrate 1 by a CVD method, thereby to embed the silicon oxide film 7 in the groove 4a. Thereafter, as shown in FIG. 44, the semiconductor substrate 1 is wet-oxidized to sinter the silicon oxide film 7. At the same time, a silicon oxide film 5 is formed on the inner walls of the groove 4a and shoulder portions of the groove 4a are rounded.

According to the present embodiment, sintering of the silicon oxide film 7, forming of the silicon oxide film 5 on the inner walls of the groove 4a, and rounding of the shoulder portions of the groove 4a are carried out simultaneously, so that the steps of forming an element isolation groove 4 can be simplified.

Embodiment 7

A method of forming an element isolation groove 4 according to the present embodiment will be explained with reference to FIGS. 45 to 48.

Figure 45:
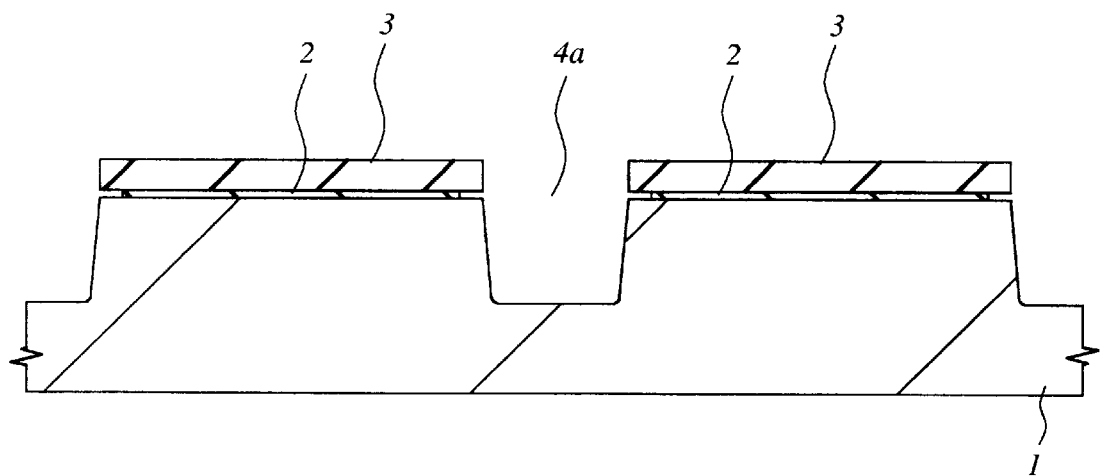
FIG. 45 is a cross-sectional view of a main part of a semiconductor substrate showing a method of manufacturing a semiconductor integrated circuit device according to an embodiment 7 of the present invention.

At first, as shown in FIG. 45, a groove 4a is formed in a semiconductor substrate 1 at an element isolation region by etching with a silicon nitride film 3 used as a mask. Thereafter, the portions of the silicon oxide film 2 which are exposed from the side walls of the groove 4a are removed by means of an etching solution containing hydrofluoric acid to displace the silicon oxide film 2 backward toward the active regions. The steps taken up to this state are the same as those in the embodiment 1.

Figure 46:
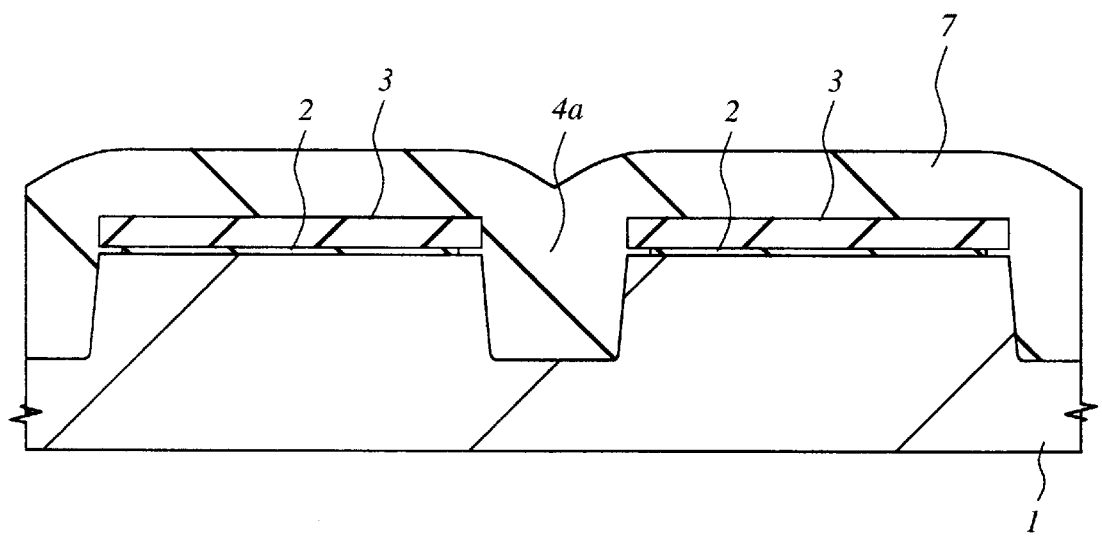
FIG. 46 is a cross-sectional view of a main part of the semiconductor substrate showing the method of manufacturing a semiconductor integrated circuit device according to the embodiment 7 of the present invention.
Figure 47:
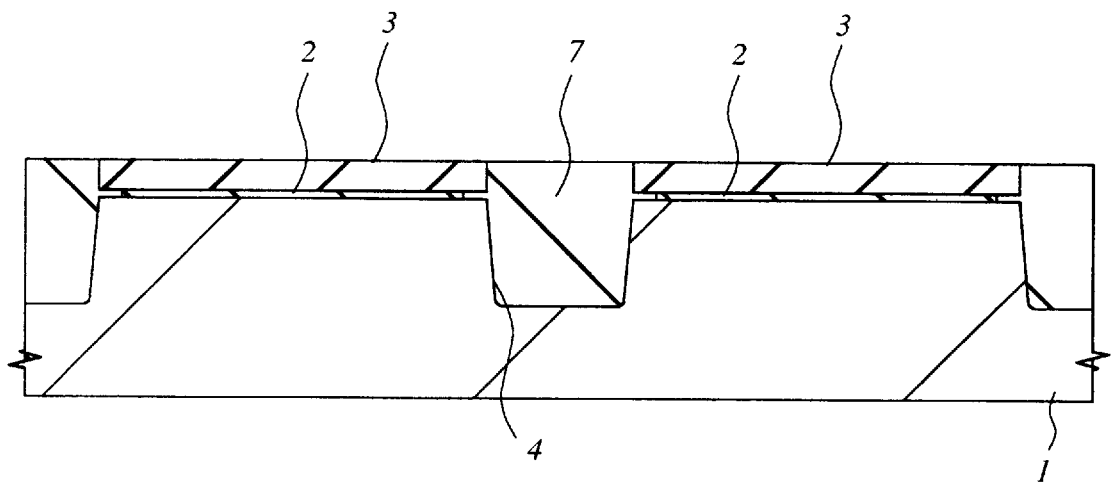
FIG. 47 is a cross-sectional view of a main part of the semiconductor substrate showing the method of manufacturing a semiconductor integrated circuit device according to the embodiment 7 of the present invention.
Figure 48:
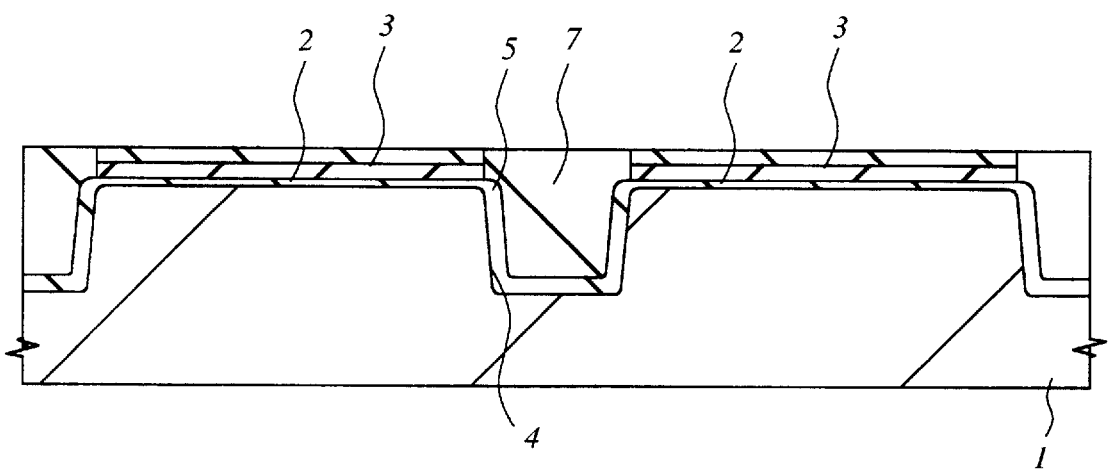
FIG. 48 is a cross-sectional view of a main part of the semiconductor substrate showing the method of manufacturing a semiconductor integrated circuit device according to the embodiment 7 of the present invention.

Next, as shown in FIG. 46, a silicon oxide film 7 is deposited on the semiconductor substrate 1 by a CVD method, thereby to embed the silicon oxide film 7 in the groove 4a. Thereafter, as shown in FIG. 47, the portions of the silicon oxide film 7 on the silicon nitride film 3 are removed so that the silicon oxide film 7 remains only inside the groove 4a, thereby to form an element isolation groove 4 in which the silicon oxide film 7 is embedded. Thereafter, as shown in FIG. 48, the semiconductor substrate 1 is wet-oxidized to sinter the silicon oxide film 7. At the same time, a silicon oxide film 5 is formed on the inner walls of the groove 4a and shoulder portions of the groove 4a are rounded.

According to the present embodiment, sintering of the silicon oxide film 7, forming of the silicon oxide film 5 on the inner walls of the groove 4a, and rounding of the shoulder portions of the groove 4a are carried out simultaneously, so that the steps of forming an element isolation groove 4 can be simplified.

Embodiment 8

A method of forming an element isolation groove 4 according to the present embodiment will be explained with reference to FIGS. 49 to 54.

Figure 49:
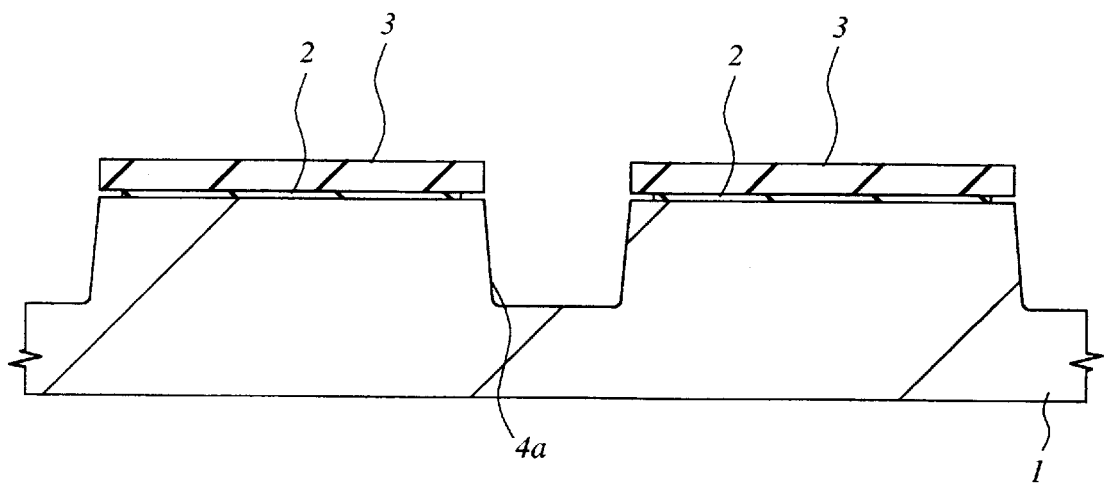
FIG. 49 is a cross-sectional view of a main part of a semiconductor substrate showing a method of manufacturing a semiconductor integrated circuit device according to an embodiment 8 of the present invention.

At first, as shown in FIG. 49, a groove 4a is formed in a semiconductor substrate 1 at an element isolation region by etching with a silicon nitride film 3 used as a mask. Thereafter, the portions of the silicon oxide film 2 which are exposed from the side walls of the groove 4a are removed by means of an etching solution containing hydrofluoric acid to displace the silicon oxide film 2 backward toward the active regions.

Figure 50:
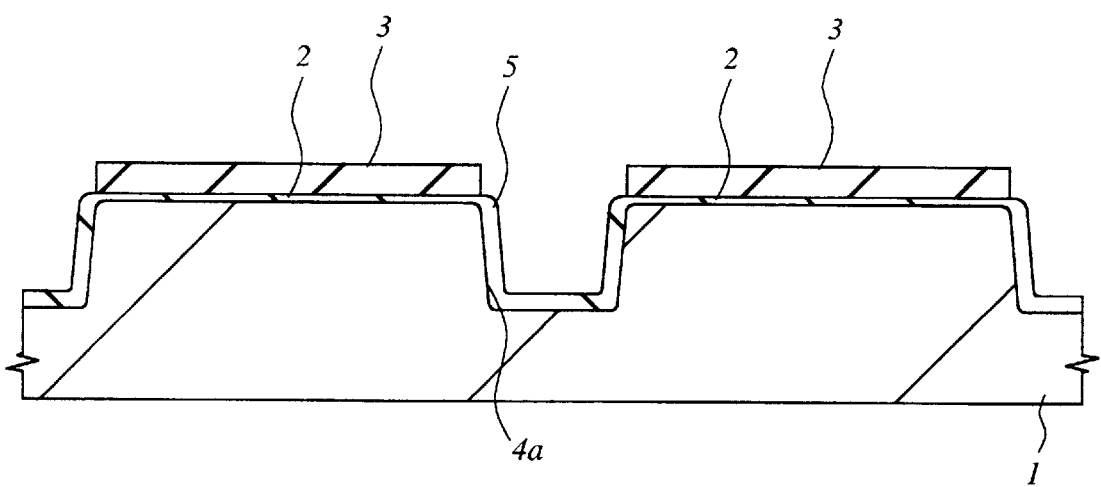
FIG. 50 is a cross-sectional view of a main part of the semiconductor substrate showing the method of manufacturing a semiconductor integrated circuit device according to the embodiment 8 of the present invention.

Next, as shown in FIG. 50, the semiconductor substrate 1 is thermally oxidized to form a silicon oxide film 5 on the inner walls of the groove 4a and shoulder portions of the groove 4a are rounded. The steps taken up to this stage are the same as those in the embodiment 1.

Figure 51:
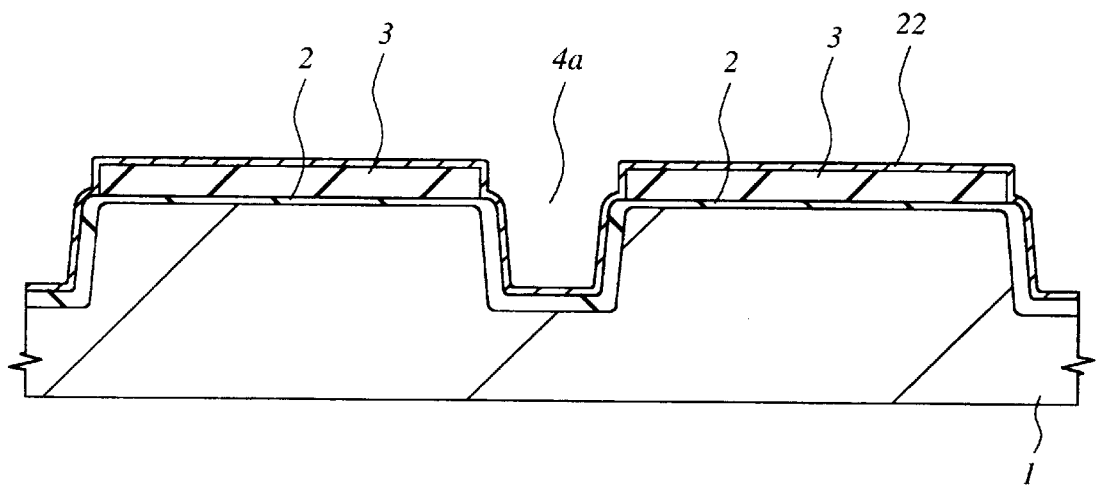
FIG. 51 is a cross-sectional view of a main part of the semiconductor substrate showing the method of manufacturing a semiconductor integrated circuit device according to the embodiment 8 of the present invention.
Figure 52:
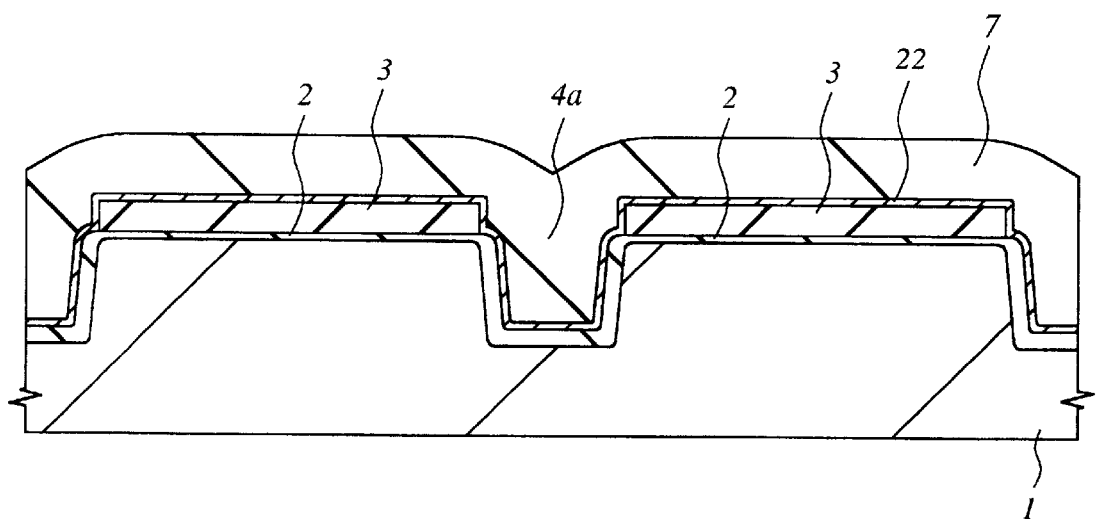
FIG. 52 is a cross-sectional view of a main part of the semiconductor substrate showing the method of manufacturing a semiconductor integrated circuit device according to the embodiment 8 of the present invention.

Subsequently, as shown in FIG. 51, a polycrystal silicon film 22 is thinly formed on the semiconductor substrate 1 by a CVD method. Thereafter, as shown in FIG. 52, a silicon oxide film 7 is deposited on the polycrystal silicon film 22 by a CVD method, thereby to embed the silicon oxide film 7 in the groove 4a.

Figure 53:
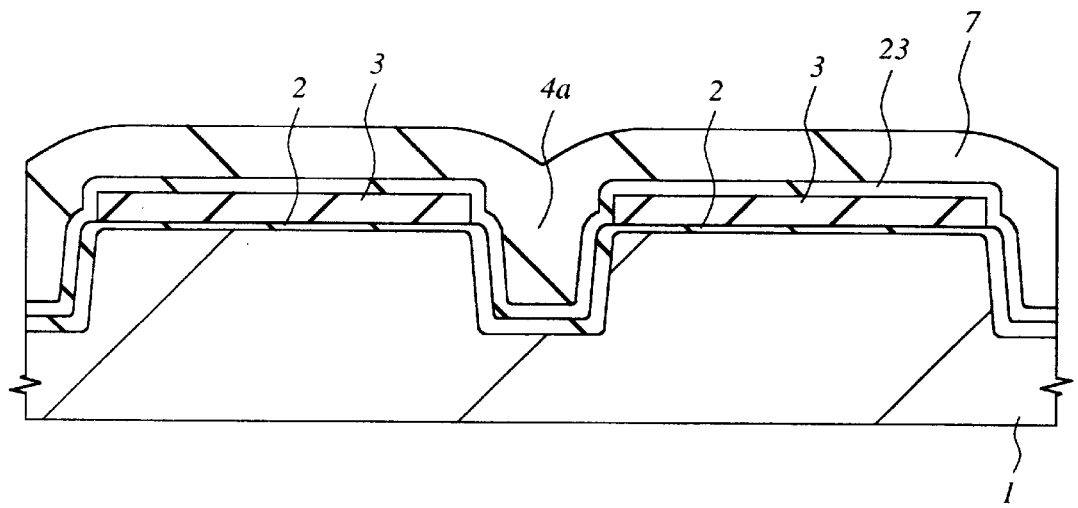
FIG. 53 is a cross-sectional view of a main part of the semiconductor substrate showing the method of manufacturing a semiconductor integrated circuit device according to the embodiment 8 of the present invention.

Next, as shown in FIG. 53, the semiconductor substrate 1 is wet-oxidized to sinter the silicon oxide film 7 embedded in the groove 4a. In this state, at least a part of the polycrystal silicon film 22 is oxidized and changed into a silicon oxide film 23. Therefore, oxidation is restrained in the vicinity of the interface between the silicon oxide film 5 and active regions of the semiconductor substrate 1, resulting in that the silicon oxide film 5 is restrained from growing toward active regions. When the polycrystal silicon film 22 is oxidized and changed into the silicon oxide film 23, the volume thereof is increased twice or so. Therefore, even when voids are formed in the silicon oxide film 7 embedded in the groove 4a, it is possible to attain an advantage that the voids can be shrunk by the increase of the volume of the silicon oxide film 23.

Figure 54:
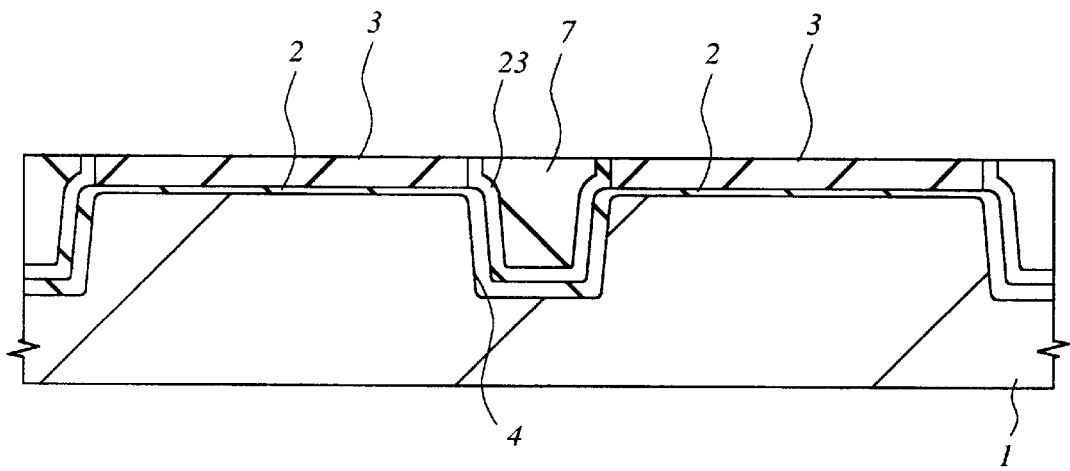
FIG. 54 is a cross-sectional view of a main part of the semiconductor substrate showing the method of manufacturing a semiconductor integrated circuit device according to the embodiment 8 of the present invention.

Thereafter, as shown in FIG. 54, the portions of the silicon oxide film 7 and the silicon oxide film 23 which are positioned above the silicon nitride film 3 are removed so that the silicon oxide film 7 and the silicon oxide film 23 remain only in the groove 4a, thus forming an element isolation groove 4. The sintering of the silicon oxide film 7 and oxidation of the polycrystal silicon film 22 may be carried out after the element isolation groove 4 is formed. An amorphous silicon film may be used in place of the polycrystal silicon film 22.

Embodiment 9

A method of forming an element isolation groove 4 according to the present embodiment will be explained with reference to FIGS. 55 and 56.

Figure 55:
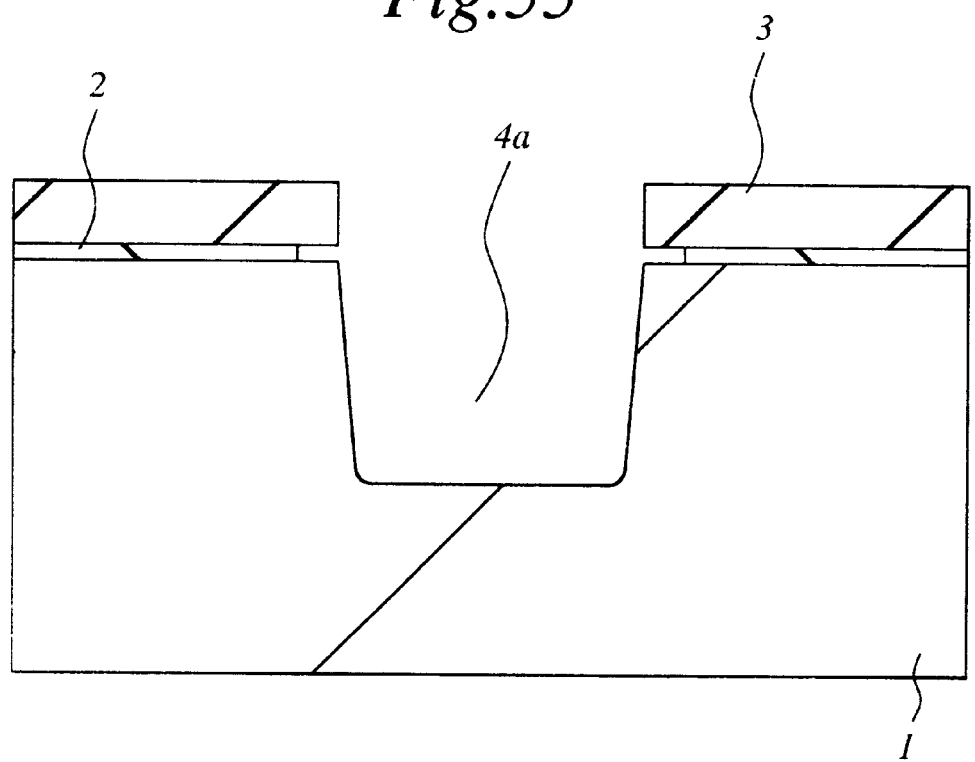
FIG. 55 is a cross-sectional view of a main part of a semiconductor substrate showing a method of manufacturing a semiconductor integrated circuit device according to an embodiment 9 of the present invention.

At first, as shown in FIG. 55, a groove 4a is formed in a semiconductor substrate 1 at an element isolation region by etching with a silicon nitride film 3 used as a mask. Thereafter, the portions of the silicon oxide film 2 which are exposed from the side walls of the groove 4a are removed by means of an etching solution containing hydrofluoric acid to displace the silicon oxide film 2 backward toward the active regions. The steps taken up to this stage are the same as those in the embodiment 1.

Figure 56:
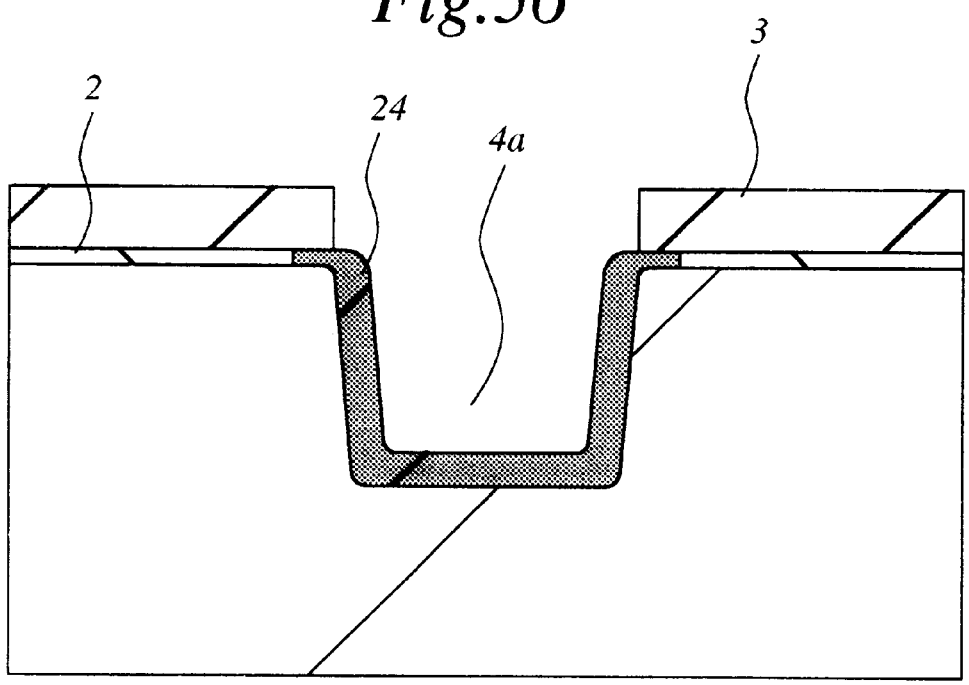
FIG. 56 is a cross-sectional view of a main part of the semiconductor substrate showing the method of manufacturing a semiconductor integrated circuit device according to the embodiment 9 of the present invention.

Next, as shown in FIG. 56, the semiconductor substrate 1 is subjected to a heat treatment in a nitrogen atmosphere, thereby to form a silicon nitride film 24 on the inner walls of the groove 4a, and shoulder portions of the groove 4a are rounded.

According to the present embodiment, since a silicon nitride film 24 is formed on the inner walls of the groove 4a, it is possible to restrain active regions of the semiconductor substrate 1 from being oxidized when sintering an silicon oxide film 7 embedded in the groove 4a later.

Embodiment 10

A method of forming an element isolation groove 4 according to the present embodiment will be explained with reference to FIGS. 57 and 58.

Figure 57:
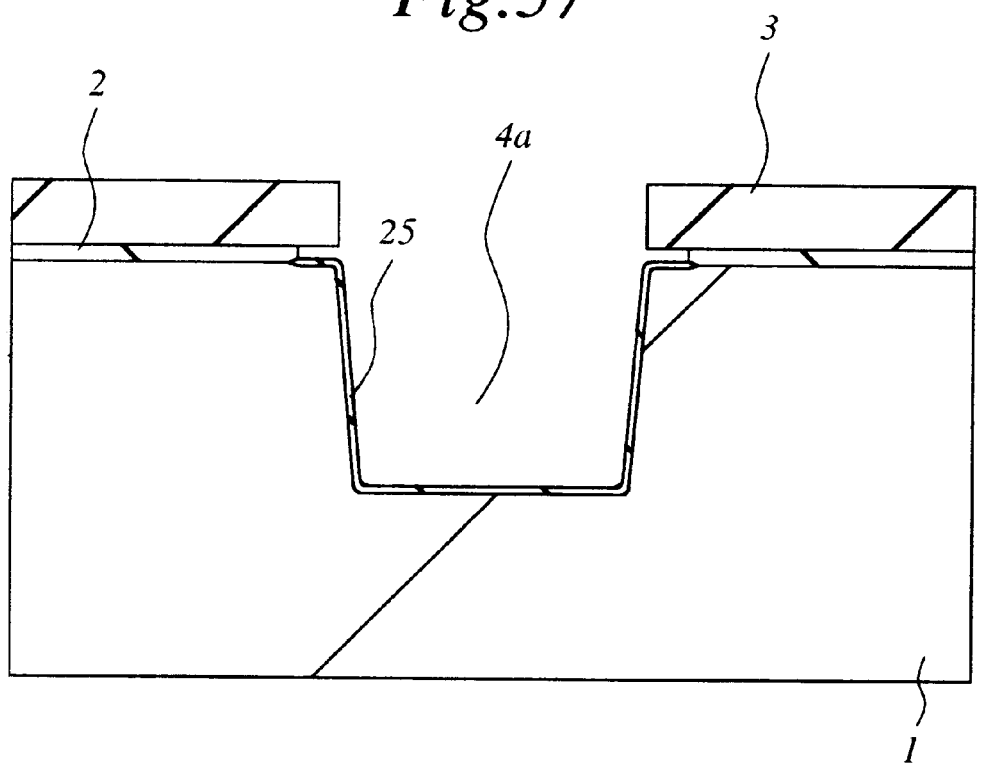
FIG. 57 is a cross-sectional view of a main part of a semiconductor substrate showing a method of manufacturing a semiconductor integrated circuit device according to an embodiment 10 of the present invention.

At first, as shown in FIG. 57, a groove 4a is formed in a semiconductor substrate 1 at an element isolation region by etching with a silicon nitride film 3 used as a mask. Thereafter, the portions of the silicon oxide film 2 which are exposed from the side walls of the groove 4a are removed by means of an etching solution containing hydrofluoric acid to displace the silicon oxide film 2 backward toward the active regions. The steps taken up to this stage are the same as those in the embodiment 1. Thereafter, the semiconductor substrate 1 is thermally oxidized to form a thin silicon oxide film 25 on the inner walls of the groove 4a.

Figure 58:
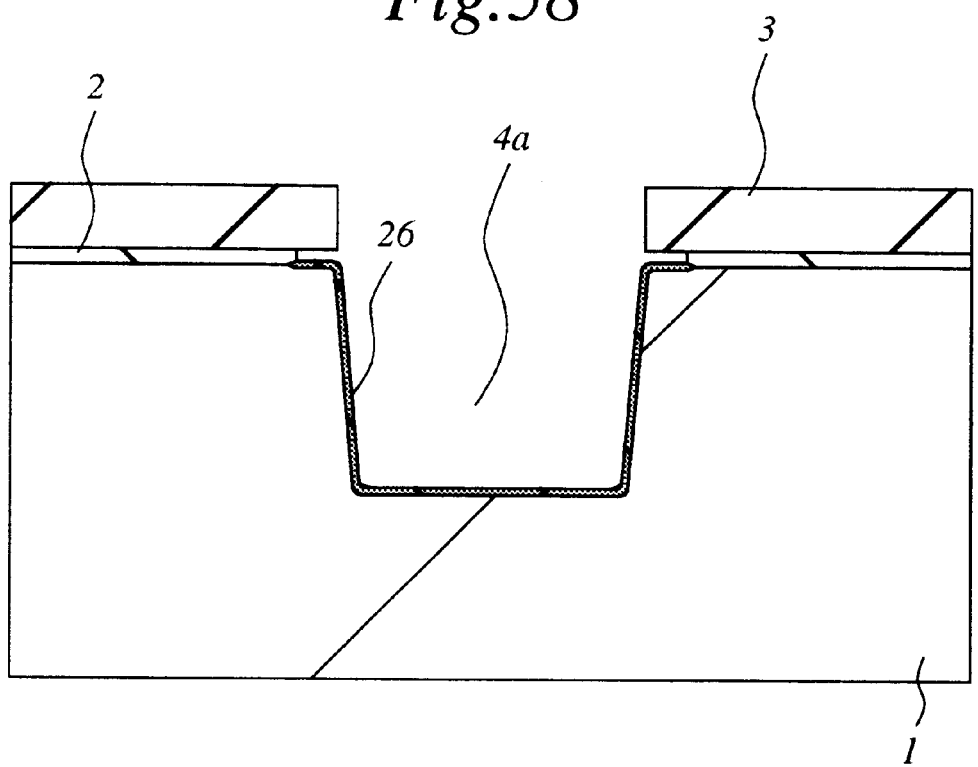
FIG. 58 is a cross-sectional view of a main part of the semiconductor substrate showing the method of manufacturing a semiconductor integrated circuit device according to the embodiment 10 of the present invention.

Next, as shown in FIG. 58, the semiconductor substrate 1 is subjected to a heat treatment in a nitrogen atmosphere, thereby to change the silicon oxide film 25 on the inner walls of the groove 4a into a silicon nitride film 26.

According to the present embodiment, since a silicon nitride film 26 is formed on the inner walls of the groove 4a, it is possible to restrain active regions of the semiconductor substrate 1 from being oxidized when sintering an silicon oxide film 7 embedded in the groove 4a later.

Embodiment 11

A method of forming an element isolation groove 4 according to the present embodiment will be explained with reference to FIGS. 59 and 60.

Figure 59:
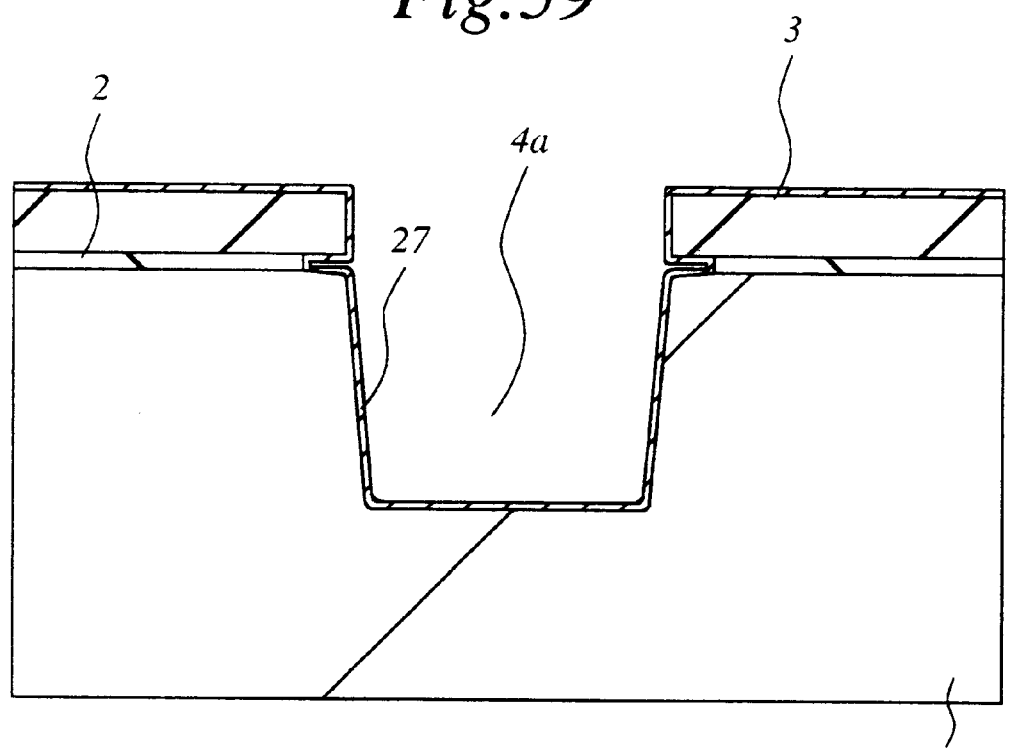
FIG. 59 is a cross-sectional view of a main part of a semiconductor substrate showing a method of manufacturing a semiconductor integrated circuit device according to an embodiment 11 of the present invention.

At first, as shown in FIG. 59, a groove 4a is formed in a semiconductor substrate 1 at an element isolation region by etching with a silicon nitride film 3 used as a mask. Thereafter, the portions of the silicon oxide film 2 which are exposed from the side walls of the groove 4a are removed by means of an etching solution containing hydrofluoric acid to displace the silicon oxide film 2 backward toward the active regions. The steps taken up to this stage are the same as those in the embodiment 1. Thereafter, a thin polycrystal silicon film 27 is deposited on the semiconductor substrate 1 by a CVD method.

Figure 60:
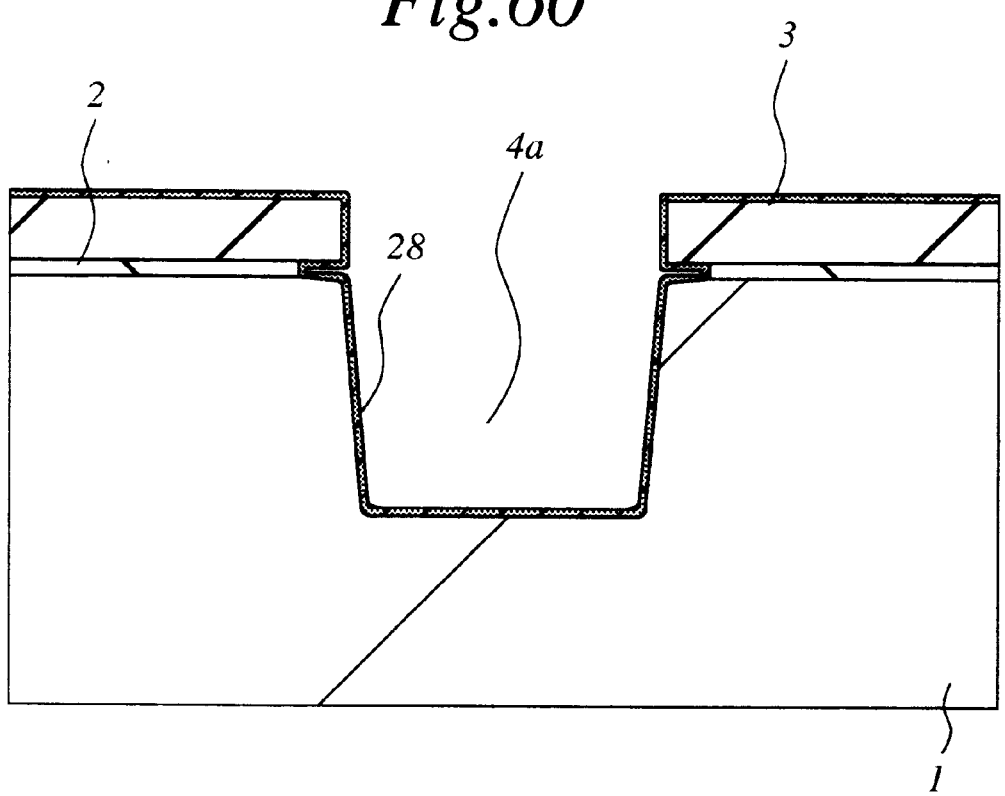
FIG. 60 is a cross-sectional view of a main part of the semiconductor substrate showing the method of manufacturing a semiconductor integrated circuit device according to the embodiment 11 of the present invention.

Next, as shown in FIG. 60, the semiconductor substrate 1 is subjected to a heat treatment in a nitrogen atmosphere, thereby to change the polycrystal silicon film 27 into a silicon nitride film 28.

According to the present embodiment, since a silicon nitride film 28 is formed on the inner walls of the groove 4a, it is possible to restrain active regions of the semiconductor substrate 1 from being oxidized when sintering an silicon oxide film 7 embedded in the groove 4a later.

This invention has been described in conjunction with the embodiments. It is noted that the invention is not restricted to these embodiments, and that various modifications may be made without departing from the spirit of this invention.

Some representative advantages of this invention may be briefly summarized as follows.

According to the present invention, the shape of an element isolation groove can be optimized by a heat treatment at a temperature of 1000° C. or less, so that downsizing of elements can be developed and electric characteristics thereof can be improved.

According to the present invention, it is possible to reduce harmful influences from a stress onto active regions due to sintering of a silicon oxide film embedded in an element isolation groove.

What is claimed is:

1. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) thermally oxidizing the semiconductor substrate to form a second silicon oxide film on an inner wall of the groove;

(d) forming a third silicon oxide film on the main surface of the semiconductor substrate to fill the groove with the third silicon oxide film;

(e) subjecting the semiconductor substrate to a heat treatment, thereby to sinter the third silicon oxide film filled in the groove;

(f) removing a portion of the third silicon oxide film which is positioned above the silicon nitride film such that the third silicon oxide film remains only in the groove; and (g) removing a portion of the silicon nitride film which is positioned above a surface of the active region whose periphery is defined by the element isolation groove, and subsequently forming a semiconductor element at the active region, wherein:

a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

2. A method according to claim 1, wherein each of a thermal oxidation temperature for forming the first silicon oxide film, a thermal oxidation temperature for forming the second silicon oxide film, and a heat treatment temperature for sintering the third silicon oxide film is equal to or less than 1000° C.

3. A method according to claim 1, wherein a thermal oxidation temperature for forming the second silicon oxide film is equal to or more than 800° C. and equal to or less than 1000° C.

4. A method according to claim 1, wherein the groove is tapered at a tapering angle θ equal to or less than 85°.

5. A method according to claim 1, wherein after the step (c) prior to the step (d) the inner wall of the groove is subjected to oxidation/nitriding processing, thereby to form a silicon nitride layer in a vicinity of an interface between the second silicon oxide film formed on the inner wall of the groove and the active region of the semiconductor substrate.

6. A method according to claim 1, wherein after the step (c) prior to the step (d) nitrogen is ion-implanted to a vicinity of an interface between the second silicon oxide film formed on the inner wall of the groove and the element isolation region of the semiconductor substrate, thereby to form a silicon nitride layer in the vicinity of the interface between the second silicon oxide film formed on the inner wall of the groove and the element isolation region of the semiconductor substrate.

7. A method according to claim 1, wherein the step (e) is carried out after the step (f).

8. A method according to claim 1, wherein the step (c) is carried out in an atmosphere containing nitrogen, thereby to form a second silicon nitride film having a film thickness which is set to be more than the film thickness of the first silicon oxide film and equal to or less than three times the film thickness thereof.

9. A method according to claim 1, wherein after the step (c) prior to the step (d) a second silicon nitride film is formed on at least a surface of the second silicon oxide film.

10. A method according to claim 1, wherein said etching a portion of the first silicon oxide film is performed after forming said groove.

11. A method according to claim 1, wherein in said thermally oxidizing step to form the second silicon oxide film, a portion of the semiconductor substrate, exposed after said etching a portion of the first silicon oxide film, also has the second silicon oxide film formed thereon.

12. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film and the first silicon oxide film in an element isolation region;

(b) subjecting a portion of a surface of the semiconductor substrate which is exposed from the first silicon oxide film to isotropic etching;

(c) selectively etching the semiconductor substrate in the element isolation region, thereby to form a groove in the main surface of the semiconductor substrate;

(d) after the step (c) thermally oxidizing the semiconductor substrate to form a second silicon oxide film on an inner wall of the groove;

(e) forming a third silicon oxide film on the main surface of the semiconductor substrate to fill the groove with the third silicon oxide film;

(f) subjecting the semiconductor substrate to a heat treatment, thereby to sinter the third silicon oxide film filled in the groove;

(g) removing a portion of the third silicon oxide film which is positioned above the silicon nitride film such that the third silicon oxide film remains only in the groove; and (h) removing a portion of the silicon nitride film which is positioned above a surface of an active region whose periphery is defined by the element isolation groove, and subsequently forming a semiconductor element at the active region.

13. A method according to claim 12, wherein the step of selectively etching to form the groove is performed after the step of subjecting a portion of the semiconductor substrate surface to isotropic etching.

14. A method according to claim 12, wherein in the step of subjecting a portion of the semiconductor substrate surface to isotropic etching, a portion of the semiconductor substrate undercutting the first silicon oxide film is removed.

15. A method of manufacturing a semiconductor integrated circuit device comprising the steps of:

(a) thermally oxidizing a semiconductor substrate to form a first silicon oxide film on a main surface of the semiconductor substrate, subsequently forming a first silicon nitride film on the first silicon oxide film, and further subsequently etching selectively the first silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) thermally oxidizing the semiconductor substrate to form a second silicon oxide film on an inner wall of the groove;

(d) forming a second silicon nitride film on the semiconductor substrate including an inside of the groove by a CVD method;

(e) forming a third silicon oxide film on the main surface of the semiconductor substrate to fill the groove with the third silicon oxide film;

(f) subjecting the semiconductor substrate to a heat treatment, thereby to sinter the third silicon oxide film filled in the groove;

(g) removing a portion of the third silicon oxide film and the second silicon nitride film which is positioned above the first silicon nitride film such that the third silicon oxide film and the second silicon nitride film remain only in the groove;

(h) removing a portion of the first silicon nitride film which is positioned above a surface of the active region whose periphery is defined by the element isolation groove, by etching;

(i) thermally oxidizing the third silicon oxide film at a shoulder portion of the element isolation groove to thicken a film thickness of the third silicon oxide film, thereby to fill a recess formed by removing the second silicon nitride film at the shoulder portion of the element isolation groove when removing the first silicon nitride film is removed by etching; and (j) forming a semiconductor element at the active region, wherein:

a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

16. A method according to claim 15, wherein step (b) is performed after step (a).

17. A method of manufacturing a semiconductor integrated circuit device comprising the steps of:

(a) thermally oxidizing a semiconductor substrate to form a first silicon oxide film on a main surface of the semiconductor substrate, subsequently forming a first silicon nitride film on the first silicon oxide film, and further subsequently etching selectively the first silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) thermally oxidizing the semiconductor substrate to form a second silicon oxide film on the inner wall of the groove;

(d) forming a second silicon nitride film on the semiconductor substrate including an inside of the groove by a CVD method;

(e) forming a third silicon oxide film on the main surface of the semiconductor substrate to fill the groove with the third silicon oxide film;

(f) removing a portion of the third silicon oxide film and the second silicon nitride film which is positioned above the first silicon nitride film such that the third silicon oxide film and the second silicon nitride film remain only in the groove;

(g) subjecting the semiconductor substrate to a heat treatment, thereby to sinter the third silicon oxide film filled in the groove, and oxidizing a surface of the first silicon nitride film and a surface of the second silicon nitride film at a shoulder portion of the element isolation groove;

(h) removing a portion of the first silicon nitride film which is positioned above a surface of the active region whose periphery is defined by the element isolation groove and an oxide film at the surface of the portion, by etching; and (i) forming a semiconductor element at the active region, wherein:

a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

18. A method according to claim 17, wherein step (b) is performed after step (a).

19. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) forming a second silicon oxide film on the main surface of the semiconductor substrate to fill the groove with the second silicon oxide film;

(d) thermally oxidizing the semiconductor substrate to sinter the second silicon oxide film filled in the groove, and to form a third silicon oxide film on an inner wall of the groove;

(e) removing a portion of the second silicon oxide film which is positioned above the silicon nitride film such that the second silicon oxide film remains only in the groove; and (f) removing a portion of the silicon nitride film which is positioned above a surface of the active region whose periphery is defined by the element isolation groove, and subsequently forming a semiconductor element at the active region, wherein:

a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

20. A method according to claim 19, wherein step (b) is performed after step (a).

21. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) forming a second silicon oxide film on the main surface of the semiconductor substrate to fill the groove with the second silicon oxide film;

(d) removing a portion of the second silicon oxide film which is positioned above the silicon nitride film such that the second silicon oxide film remains only in the groove;

(e) thermally oxidizing the semiconductor substrate to sinter the second silicon oxide film filled in the groove, and to form a third silicon oxide film on an inner wall of the groove; and (f) removing a portion of the silicon nitride film which is positioned above a surface of the active region whose periphery is defined by the element isolation groove, and subsequently forming a semiconductor element at the active region, wherein:

a displacement amount of the first silicon oxide film is set to be equal to or more than a film thickness of the second silicon oxide film and equal to or less than twice the film thickness thereof; and a film thickness of the third silicon oxide film is set to be more than a film thickness of the first silicon oxide film and equal to or less than three times the film thickness thereof.

22. A method according to claim 21, wherein step (b) is performed after step (a).

23. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) thermally oxidizing the semiconductor substrate to form a second silicon oxide film on an inner wall of the groove;

(d) forming a polycrystal silicon film on the main surface of the semiconductor substrate;

(e) forming a third silicon oxide film on the main surface of the semiconductor substrate to fill the groove with the third silicon oxide film;

(f) subjecting the semiconductor substrate to a heat treatment, thereby to sinter the third silicon oxide film filled in the groove, and oxidizing the polycrystal silicon film, thereby to change at least a part of the polycrystal silicon film into a silicon oxide film;

(g) removing a portion of the third silicon oxide film and the silicon oxide film which is positioned above the silicon nitride film such that the third silicon oxide film and the silicon oxide film remain only in the groove; and (h) removing a portion of the silicon nitride film which is positioned above a surface of the active region whose periphery is defined by the element isolation groove, and subsequently forming a semiconductor element at the active region, wherein:

a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

24. A method according to claim 23, wherein step (b) is performed after step (a).

25. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in a main surface of the semiconductor substrate;

(b) etching a portion of the first silicon oxide film which is exposed from the groove to displace the first silicon oxide film backward toward an active region;

(c) thermally oxidizing the semiconductor substrate to form a second silicon oxide film on an inner wall of the groove;

(d) forming a polycrystal silicon film on the main surface of the semiconductor substrate;

(e) forming a third silicon oxide film on the main surface of the semiconductor substrate to fill the groove with the third silicon oxide film;

(f) removing a portion of the third silicon oxide film and the polycrystal silicon film which is positioned above the silicon nitride film such that the third silicon oxide film and the polycrystal silicon film remain only in the groove;

(g) subjecting the semiconductor substrate to a heat treatment, thereby to sinter the third silicon oxide film filled in the groove, and oxidizing the polycrystal silicon film, thereby to change at least a part of the polycrystal silicon film into a silicon oxide film; and (h) removing a portion of the silicon nitride film which is positioned above a surface of the active region whose periphery is defined by the element isolation groove, and subsequently forming a semiconductor element at the active region, wherein:

a displacement amount of the first silicon oxide film is set to be equal to or more than a film thickness of the second silicon oxide film and equal to or less than twice the film thickness thereof; and the film thickness of the second silicon oxide film is set to be more than a film thickness of the first silicon oxide film and equal to or less than three times the film thickness thereof.

26. A method according to claim 25, wherein step (b) is performed after step (a).

27. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) thermally nitriding the semiconductor substrate to form a second silicon nitride film on an inner wall of the groove;

(d) forming a second silicon oxide film on the main surface of the semiconductor substrate to fill the groove with the second silicon oxide film;

(e) subjecting the semiconductor substrate to a heat treatment, thereby to sinter the second silicon oxide film filled in the groove;

(f) removing a portion of the second silicon oxide film which is positioned above the first silicon nitride film such that the second silicon oxide film remains only in the groove; and (g) removing a portion of the first silicon nitride film which is positioned above a surface of the active region whose periphery is defined by the element isolation groove, and subsequently forming a semiconductor element at the active region.

28. A method according to claim 27, wherein step (b) is performed after step (a).

29. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) thermally oxidizing the semiconductor substrate to form a second silicon oxide film on an inner wall of the groove, and subsequently nitriding the second silicon oxide film, thereby to change at least a part of the second silicon oxide film into a silicon nitride film;

(d) forming a third silicon oxide film on the main surface of the semiconductor substrate to fill the groove with the third silicon oxide film;

(e) subjecting the semiconductor substrate to a heat treatment, thereby to sinter the third silicon oxide film filled in the groove;

(f) removing a portion of the third silicon oxide film which is positioned above the first silicon nitride film such that the third silicon oxide film remains only in the groove; and (g) removing a portion of the first silicon nitride film which is positioned above a surface of the active region whose periphery is defined by the element isolation groove, and subsequently forming a semiconductor element at the active region.

30. A method according to claim 29, wherein step (b) is performed after step (a).

31. A method of manufacturing a semiconductor integrated circuit device comprising the steps of:

(a) thermally oxidizing a semiconductor substrate to form a first silicon oxide film on a main surface of the semiconductor substrate, subsequently forming a silicon nitride film on the first silicon oxide film, and further subsequently etching selectively the silicon nitride film, the first silicon oxide film, and the semiconductor substrate in an element isolation region, thereby to form a groove in the main surface of the semiconductor substrate;

(b) etching a portion of the first silicon oxide film which is exposed from the groove to displace the first silicon oxide film backward toward an active region;

(c) forming a polycrystal silicon film on the semiconductor substrate, and subsequently nitriding the polycrystal silicon film, thereby to change at least a part of the polycrystal silicon film into a silicon nitride film;

(d) forming a second silicon oxide film on the main surface of the semiconductor substrate to fill the groove with the second silicon oxide film;

(e) subjecting the semiconductor substrate to a heat treatment, thereby to sinter the second silicon oxide film filled in the groove;

(f) removing a portion of the second silicon oxide film which is positioned above the first silicon nitride film such that the second silicon oxide film remains only in the groove; and (g) removing a portion of the first silicon nitride film which is positioned above a surface of the active region whose periphery is defined by the element isolation groove, and subsequently forming a semiconductor element at the active region.

32. A method according to claim 31, wherein step (b) is xperformed after step (a).

* * * * *